(12) United States Patent
Lin et al.

(10) Patent No.: US 12,161,057 B2
(45) Date of Patent: Dec. 3, 2024

(54) METHOD FOR FORMING SEMICONDUCTOR STRUCTURE

(71) Applicant: TAIWAN SEMICONDUCTOR MANUFACTURING COMPANY LTD., Hsinchu (TW)

(72) Inventors: Hsing-Lien Lin, Hsin-Chu (TW); Fu-Ting Sung, Taoyuan (TW); Ching Ju Yang, Hsinchu (TW); Chii-Ming Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 43 days.

(21) Appl. No.: 18/302,007

(22) Filed: Apr. 18, 2023

(65) Prior Publication Data

US 2023/0255125 A1 Aug. 10, 2023

Related U.S. Application Data

(62) Division of application No. 16/844,875, filed on Apr. 9, 2020, now Pat. No. 11,637,240.

(60) Provisional application No. 62/928,744, filed on Oct. 31, 2019.

(51) Int. Cl.
| | |
|---|---|
| *H10N 70/00* | (2023.01) |
| *G11C 13/00* | (2006.01) |
| *H10B 63/00* | (2023.01) |
| *H10N 70/20* | (2023.01) |

(52) U.S. Cl.
CPC ....... *H10N 70/841* (2023.02); *G11C 13/0007* (2013.01); *H10B 63/30* (2023.02); *H10N 70/253* (2023.02); *H10N 70/826* (2023.02); *H10N 70/883* (2023.02)

(58) Field of Classification Search
CPC ... H10N 70/011; H10N 70/063; H10N 70/826
See application file for complete search history.

(56) References Cited

U.S. PATENT DOCUMENTS 11,637,240 B2 * 4/2023 Lin ..................... H10N 70/231
257/4

* cited by examiner

*Primary Examiner* — Mark V Prenty
(74) *Attorney, Agent, or Firm* — WPAT Law; Anthony King

(57) ABSTRACT

A method for forming a semiconductor memory structure include forming a pillar structure. The pillar structure includes a first conductive layer, a second conductive layer and a data storage material layer between the first and second conducive layers. A sidewall of the first conductive layer, a sidewall of the data storage layer and a sidewall of the second conductive layer are exposed. An oxygen-containing plasma treatment is performed on the pillar structure to form hydrophilic surfaces of the sidewall of the first conductive layer, the sidewall of the data storage layer and the sidewall of the second conductive layer. An encapsulation layer is formed over the pillar structure and the dielectric layer. The encapsulation layer is in contact with the hydrophilic surfaces of the sidewall of the first conductive layer, the sidewall of the data storage layer and the sidewall of the second conductive layer.

20 Claims, 19 Drawing Sheets

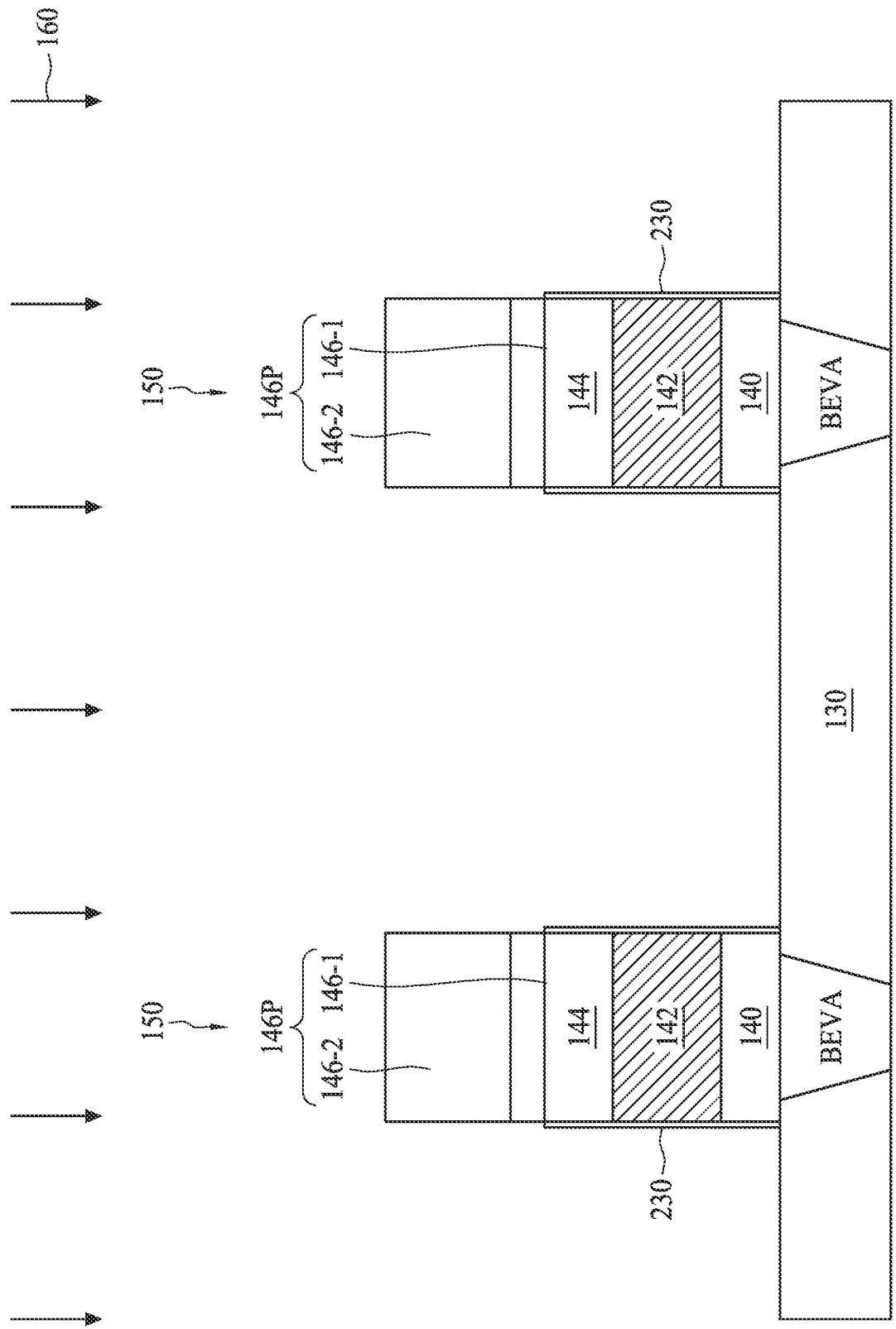

METHOD FOR FORMING SEMICONDUCTOR STRUCTURE

PRIORITY DATA

This patent is a divisional application of U.S. patent application Ser. No. 16/844,875 filed on Apr. 9, 2020, entitled of "SEMICONDUCTOR STRUCTURE AND METHOD FOR FORMING THE SAME", which claims the benefit of U.S. Provisional Patent Application Ser. No. 62/928,744 filed Oct. 31, 2019, the entire disclosure of which is hereby incorporated by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and decreasing associated costs. For example, the scaling-down process allows for memory and logic device structures to be integrated together in an IC chip.

However, these advances have increased the complexity of processing and manufacturing ICs. As feature sizes continue to decrease, fabrication processes continue to become more difficult to perform. Therefore, it is increasingly challenging to form reliable IC devices of smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A to 6C are schematic drawings illustrating a semiconductor memory structure at a fabrication stage subsequent to that illustrated in FIG. 5 according to aspects of the present disclosure in different embodiments.

DETAILED DESCRIPTION

Figure 1:
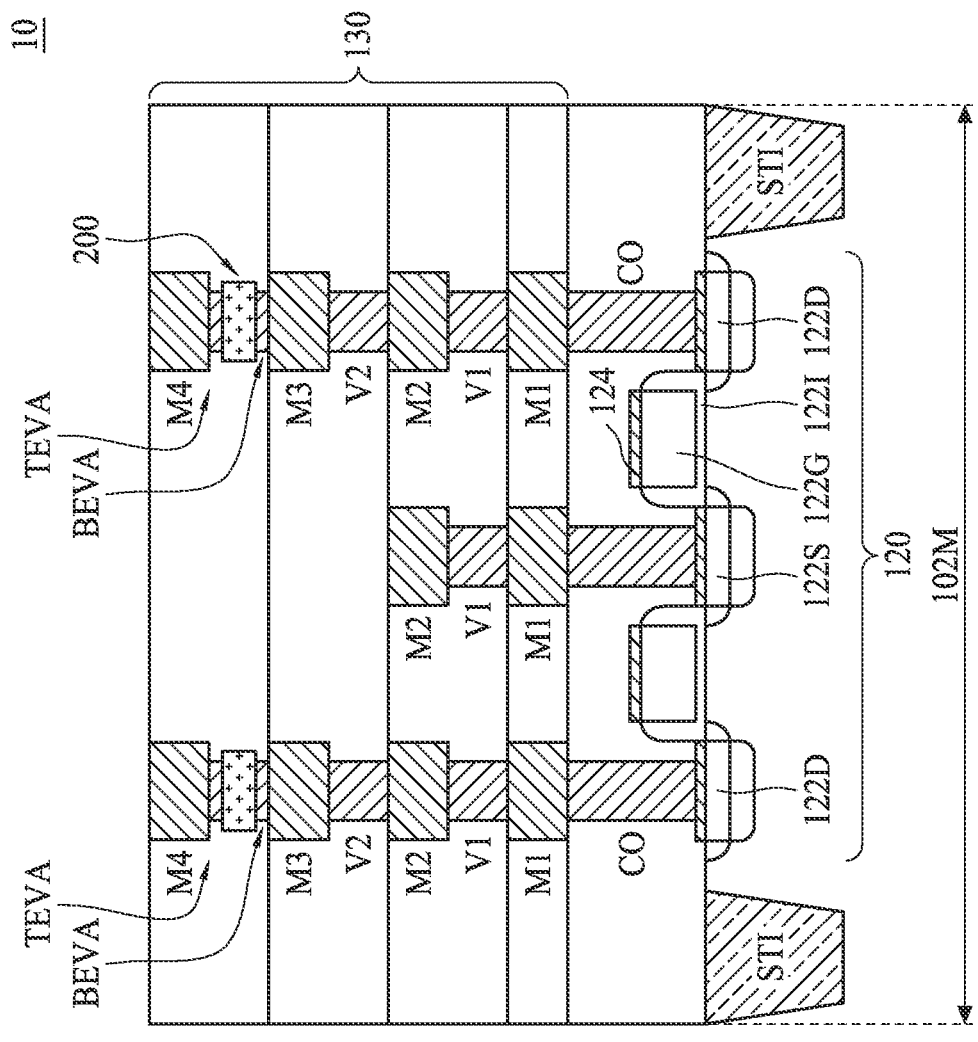
FIG. 1 is a schematic drawing illustrating a semiconductor structure according to aspects of the present disclosure in one or more embodiments.
Figure 1:
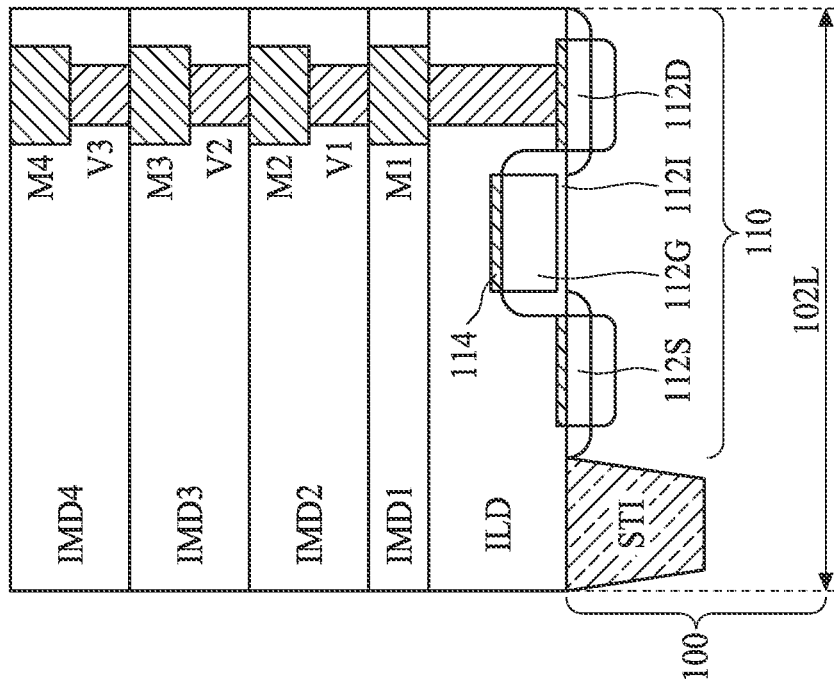

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A semiconductor memory cell, such as a phase change memory (PCM) cell, may include a data-storage element between a top electrode and a bottom electrode. When forming the memory cell, a first conductive layer, a data storage layer, and a second conductive layer may be sequentially formed, and a patterned hard mask is formed over the stacked layers. The bottom conductive layer, the data storage layer and the top conductive layer may be etched through the patterned hard mask to form a plurality of pillars respectively including the patterned first conductive layer serving as the bottom electrode, the patterned data storage layer serving as the data-storage element, and the patterned second conductive layer serving as the top electrode. In some comparative approaches, an encapsulation layer may be formed to cover sidewalls of each cell pillar in order to protect the sidewalls of the pillars in subsequent manufacturing operations.

In some embodiments, a measure of how well a layer is formed is expressed by a ratio of a minimum thickness of the layer as it crosses a step, to a thickness of the layer on flat regions. This layer property is referred to as the "step coverage" of the layer. It is found that an aspect ratio, which is defined as a height to a width of a feature, may affect the step coverage. For example, the greater the aspect ratio of the feature is, the more difficult it is to have a uniform step coverage. In some comparative approaches, an aspect ratio of the cell pillars may be greater than approximately 20. It is found that the encapsulation layer suffers from the step coverage issue.

Further, the encapsulation layer typically includes an insulating material. It is found that such insulating material layer may have different incubation times when being formed on different materials. For example, when concurrently depositing the encapsulation layer on the sidewalls of the conductive layers (i.e., the top electrode, the data-storage element and the bottom electrode) and sidewalls of the dielectric layers (i.e., the patterned hard mask), an incubation time of the encapsulation layer on the conductive layers is greater than an incubation time of the encapsulation layer on the dielectric layers. In some comparative approaches, this condition can be referred to as an incubation delay. In some comparative approaches, the incubation delay issue plays more important role in the forming of the encapsulation layer than the above mentioned step coverage issue. In some comparative approaches, the incubation delay issue is a major problem in the forming of the encapsulation layer, and may be exacerbated by the step coverage issue.

The present disclosure therefore provides a semiconductor structure including a memory structure and a method for forming the same. In the semiconductor memory structure, a hydrophilic surface or a nucleation layer is formed prior to the forming of the encapsulation layer. The hydrophilic surface or nucleation layer provides a surface that is suitable for the forming of the encapsulation layer. In some embodiments, the hydrophilic surface or the nucleation layer can be formed by an oxygen-containing (O-containing) plasma treatment. In some embodiments, the incubation delay issue can be mitigated by the hydrophilic surface or the nucleation layer. In some embodiments, it is found that the step coverage issue can be also mitigated by the hydrophilic surface or the nucleation layer. Consequently, a thickness uniformity of the encapsulation layer is improved.

Figure 2:
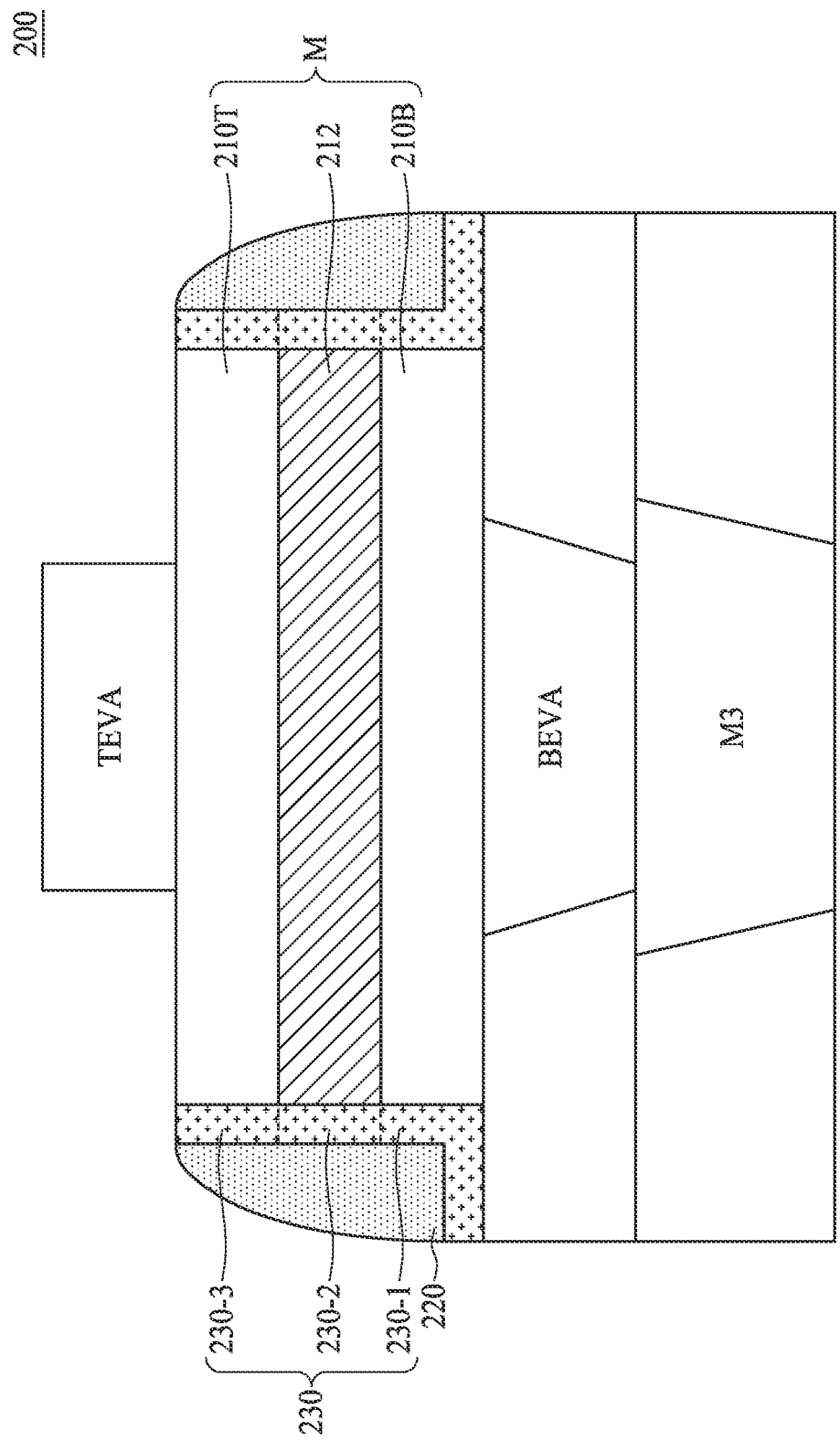
FIG. 2 is a schematic drawing illustrating a semiconductor memory structure according to aspects of the present disclosure in one or more embodiments.

FIG. 1 is a schematic drawing illustrating a semiconductor structure including a memory structure 10 according to aspects of the present disclosure in one or more embodiments. FIG. 2 is an enlarged view of a portion of the semiconductor memory structure according to aspects of the present disclosure in one or more embodiments. Referring to FIG. 1, the semiconductor structure including the memory structure 10 includes a substrate 100. The substrate 100 may be a semiconductor substrate formed of commonly used semiconductor materials such as silicon (Si), silicon germanium (SiGe), gallium arsenide (GaAs), or the like, and may be a bulk substrate or a semiconductor-on-insulator (SOI) substrate. In some embodiments, the substrate 100 can include a plurality of functional regions. The plurality of functional regions can be defined and electrically isolated from each other by isolation structures, such as shallow trench isolations (STIs), but the disclosure is not limited thereto. For example but not limited thereto, the substrate can include a logic region 102L and a memory region 102M that are defined and electrically isolated from other functional regions by the STIs. The logic region 102L may include circuitry, such as the exemplary transistor 110, for processing information received from memory cells and for controlling reading and writing functions of the memory structures. In some embodiments, access transistors 120 are disposed in the memory region 102M. The transistor 110 in the logic region 102L can include a gate dielectric layer 112I, a gate conductive layer 112G, source/drain regions 112S/112D, and silicides 114, but the disclosure is not limited thereto. The access transistors 120 in the memory region 102M can include a gate dielectric layer 122I, a gate conductive layer 122G, source/drain regions 122S/122D, and silicides 124, but the disclosure is not limited thereto. For simplicity, components such as spacers and contact etch stop layers (CESL) that are commonly formed in integrated circuits are not illustrated herein.

Still referring to FIG. 1, an inter-layer dielectric layer ILD is formed over the transistor 110 and the access transistors 120, and contact plugs CO are formed in the inter-layer dielectric layer ILD for providing electrical connections between other circuitry/elements and the source/drain regions 112S/112D of the transistor 110, and between other circuitry/elements and the source/drain regions 122S/122D of the access transistors 120. The formation operations of the contact plugs CO can include forming openings in the inter-layer dielectric layer ILD, filling the openings and performing a planarization such as chemical mechanical polishing (CMP). For simplicity, the gate contact plug is not shown, although it is also formed simultaneously with the contact plugs CO shown in FIG. 1. In some embodiments, the contact plugs CO can include tungsten (W), but other suitable conductive materials such as silver (Ag), aluminum (Al), copper (Cu), AlCu, and the like may also be used or added.

Still referring to FIG. 1, an interconnect structure 130 is disposed over the inter-layer dielectric layer ILD and the contact plugs CO. In some embodiments, the interconnect structure 130 includes a plurality of conductive layers. For example, the interconnect structure 130 includes a plurality of metal layers labeled M1 through M4 and a plurality of connecting vias labeled V1 through V3. Further, the metal layers M1 through M4 and the connecting vias V1 through V3 are disposed in a plurality of inter-metal dielectric layers labeled IMD1 through IMD4. The inter-metal dielectric layers IMD1 through IMD4 may provide electrical insulating as well as structural support for the various features during subsequent fabrication operations. In some embodiments, the inter-metal dielectric layers IMD1 through IMD4 may be formed of low-k dielectric material, for example, material with k value lower than about 3.0, or even lower than about 2.5, but the disclosure is not limited thereto. In some embodiments, a memory device can be integrated in the interconnect structure 130. For example, the memory structure can be integrated over the metal layer M3 and in the inter-metal dielectric layer IMD4, but the disclosure is not limited thereto. In other words, the memory structure can be integrated over any of the metal layers Mn and in the inter-metal dielectric layer IMDn, and n is a positive integer. In some embodiments, the formation operations of the metal layers Mn and the connecting vias Vn can include forming openings in the inter-metal dielectric layer IMDn, filling the openings with conductive materials and performing a planarization such as CMP. In some embodiments, the metal layers M1 through M4 and the connecting vias V1 through V3 can include W, Al, Cu, AlCu, and the like. Additionally, a barrier layer (not shown) can be disposed between the metal layers M1 through M4 and the inter-metal layers IMD1 through IMD4.

The semiconductor structure 10 includes a plurality of semiconductor memory structures 200 disposed in the interconnect structure 130, as shown in FIG. 1. The semiconductor memory structures 200 are disposed in one of the inter-metal layers IMDn. Further, the semiconductor memory structures 200 are respectively disposed between two metal layers Mn and Mn−1. For example, the semiconductor memory structures 200 can be disposed in the inter-metal layer IMD4, and further between the metal layer M4 and the metal layer M3. Further, each of the semiconductor memory structures 200 is electrically connected to the metal layer M4 by a top via TEVA and electrically connected to the metal layer M3 by a bottom via BEVA. As mentioned above, the other metal layers Mn and Mn−1 can be electrically connected by the connecting vias Vn−1. In some embodiments, a height of the connecting via Vn−1 in the inter-metal layer IMDn is substantially the same as a sum of a height of the memory structure 200 and a height of the top via TEVA and a height of the bottom via BEVA in the same inter-metal dielectric layer IMDn. For example, in the abovementioned embodiments, a height of the connecting via V3 in the inter-metal layer IMD4 is substantially the same as a sum of a height of the semiconductor memory structure 200 and a height of the top via TEVA and a height of the bottom via BEVA in the inter-metal dielectric layer IMD4.

Referring to FIG. 2, the semiconductor memory structure 200 is disposed between and coupled to the top via TEVA and the bottom via BEVA. The semiconductor memory structure 200 includes a bottom electrode 210B, a top electrode 210T and a data-storage element 212 disposed between the top electrode 210T and the bottom electrode 210B. In some embodiments, the top electrode 210T, the bottom electrode 210B and the data-storage element 212 are referred to as a memory cell M. The top electrode 210T and the bottom electrode 210B are conductive, and may include, for example, metals, metal nitrides, or other suitable conductive materials. For example but not limited thereto, the top electrode 210T and the bottom electrode 210B can include tantalum nitride (TaN), tantalum (Ta), titanium nitride (TiN), tungsten nitride (WN), W, palladium (Pd), nickel (Ni), nickel chromium (NiCr), zirconium (Zr), or niobium (Nb).

In some embodiments, the data-storage element 212 includes a phase change material that is able to reversibly change between a first data state (e.g., a first resistance) and a second data state (e.g., a second resistance) depending on a voltage applied across the data-storage element 212. In some embodiments, the phase change material can include chalcogenide materials including one or more of germanium (Ge), tellurium (Te), antimony (Sb) and stoichiometric materials. In some embodiments, the phase change material 226 can include a Ge—Sb—Te (GST) compound such as $Ge_2Sb_2Te_5$ (also referred to as GST225), but the disclosure is not limited thereto. In some embodiments, the phase change material can include Si—Sb—Te compounds, Ga—Sb—Te compounds, As—Sb—Te compounds, Ag—In—Sb—Te compounds, Ge—In—Sb—Te compounds, Ge—Sb compounds, Sb—Te compounds, Si—Sb compounds, or a combinations thereof. The phase change material is chosen to be a material that will undergo a phase change such as from amorphous to crystalline or vice versa when heated.

In some embodiments where the memory cell being manufactured is a resistive random memory (RRAM) cell, the data-storage element 212 may include, for example, hafnium oxide, other suitable high-κ dielectrics, or other suitable dielectrics. In some embodiments where the memory cell under manufacture is a magneto-resistive (MRAM) cell, the data-storage element 212 may include, for example, an MTJ layer or another suitable magnetic storage structure. The MTJ layer may include, for example, a first ferromagnetic layer, an insulating layer overlying the first ferromagnetic layer, and a second ferromagnetic layer overlying the insulating layer. In some embodiments where the memory cell be manufactured is an RRAM cell, the data-storage element 212 may include, for example, hafnium oxide, another suitable high-κ dielectrics, or another suitable dielectrics.

In some embodiments where the memory cell being manufactured is a conductive bridge random memory (CBRAM) cell, the data-storage element 212 may include, for example, a switching layer and a capping layer. The CBRAM cell employs active metal ions in the switching layer to form conductive filaments. An ion reservoir region may be formed in the capping layer and configured as an active metal reservoir region to store active metal ions. In some embodiments, the material of the capping layer having the ion reservoir region may include, but is not limited to, a metal such as copper, silver, aluminum, nickel or the like, a metal compound such as copper tantalum or the like, or a metal compound such as copper tellurium or the like. The material of the switching layer may include, but is not limited thereto, a compound such as an ion compound, a covalent compound, an oxide compound, a semiconductive material or the like. By way of example, the ion compound may include germanium sulfide (GeS), germanium antimony tellurium (GeShTe) or the like. The covalent compound may include arsenic sulfide (AsS) or the like. The oxide compound may include tantalum oxide, silicon oxide, aluminum oxide, titanium oxide or the like. The semiconductive material may include amorphous silicon or the like.

The semiconductor memory structure 200 includes an encapsulation layer 220 disposed over a sidewall of the memory cell M, as shown in FIG. 2. The encapsulation layer 220 includes an insulating material. In some embodiments, the encapsulation layer 220 includes silicon nitride, but the disclosure is not limited thereto. In other embodiments, the encapsulation layer 220 can include silicon oxide, silicon oxynitride, another suitable dielectrics, or any combination therefore. In some embodiments, a thickness of the encapsulation layer 220 is between approximately 20 Å and approximately 60 Å. In some comparative approaches, when the thickness of the encapsulation layer 220 is less than approximately 20 Å, the encapsulation layer 220 may not be thick enough to protect the top electrode 210T, the bottom electrode 210B and the data-storage element 212, such that the top electrode 210T, the bottom electrode 210B and the data-storage element 212 may be damaged in subsequent manufacturing operations.

In some embodiments, the semiconductor memory structure 200 further includes a nucleation layer 230 between the sidewall of the memory cell M and the encapsulation layer 220, as shown in FIG. 2. In some embodiments, the nucleation layer 230 includes oxide. In some embodiments, the nucleation layer 230 includes metal oxide. In some embodiments, a thickness of the nucleation layer 230 is between approximately 1 Å and approximately 10 Å. In some embodiments, the nucleation layer 230 includes a first portion 230-1 over the bottom electrode 210B, a second portion 230-2 over the data-storage element 212 and a third portion 230-3 over the top electrode 210T. In some embodiments, the first portion 230-1 and the third portion 230-3 include a same material. In some embodiments, the first portion 230-1 and the third portion 230-3 include oxides of materials used to form the bottom electrode 210B and the top electrode 210T. For example, the first portion 230-1 and the third portion 230-3 can include oxide of tantalum nitride, titanium nitride, and/or tungsten nitride. In some embodiments, the first portion 230-1 and the third portion 230-3 include metal oxide of metal materials used to form the bottom electrode 210B and the top electrode 210T. For example, the first portion 230-1 and the third portion 230-3 can include tantalum oxide, tungsten oxide, palladium oxide, nickel oxide, nickel chromium oxide, zirconium oxide, or niobium oxide. In some embodiments, the second portion 230-2 includes a material different from the materials of the first portion 230-1 and the third portion 230-3. For example, the second portion 230-2 can include oxide of GST compound, oxide of Si—Sb—Te compounds, oxide of Ga—Sb—Te compounds, oxide of As—Sb—Te compounds, oxide of Ag—In—Sb—Te compounds, oxide of Ge—In—Sb—Te compounds, oxide of Ge—Sb compounds, oxide of Sb—Te compounds, or oxide of Si—Sb compounds. In some embodiments, the first portion 230-1 can be referred to as a first oxide layer, the second portion 230-2 can be referred to as a second oxide layer, and the third portion 230-3 can be referred to as a third oxide layer. As mentioned above, the first oxide layer 230-1 and the third oxide layer 230-3 can include a same material, such as the same metal oxide. The second oxide layer 230-2 can include a material different from that of the first and third oxide layers 230-1 and 230-3.

In some embodiments, the nucleation layer 230 has a surface facing the encapsulation layer 220, and such surface is a hydrophilic surface. A surface can be referred to as a hydrophilic surface if a droplet of water spreading on the surface forms a contact angle with the surface of less than 90°. In some embodiments, a thickness of the nucleation layer 230 can be less than approximately 1 Å. In such embodiments, the nucleation layer 230 is so thin that it can be referred to as a hydrophilic surface formed by a sidewall surface of the top electrode 210T, a sidewall surface of the data-storage element 212 and a sidewall surface of the bottom electrode 210B.

Figure 3:
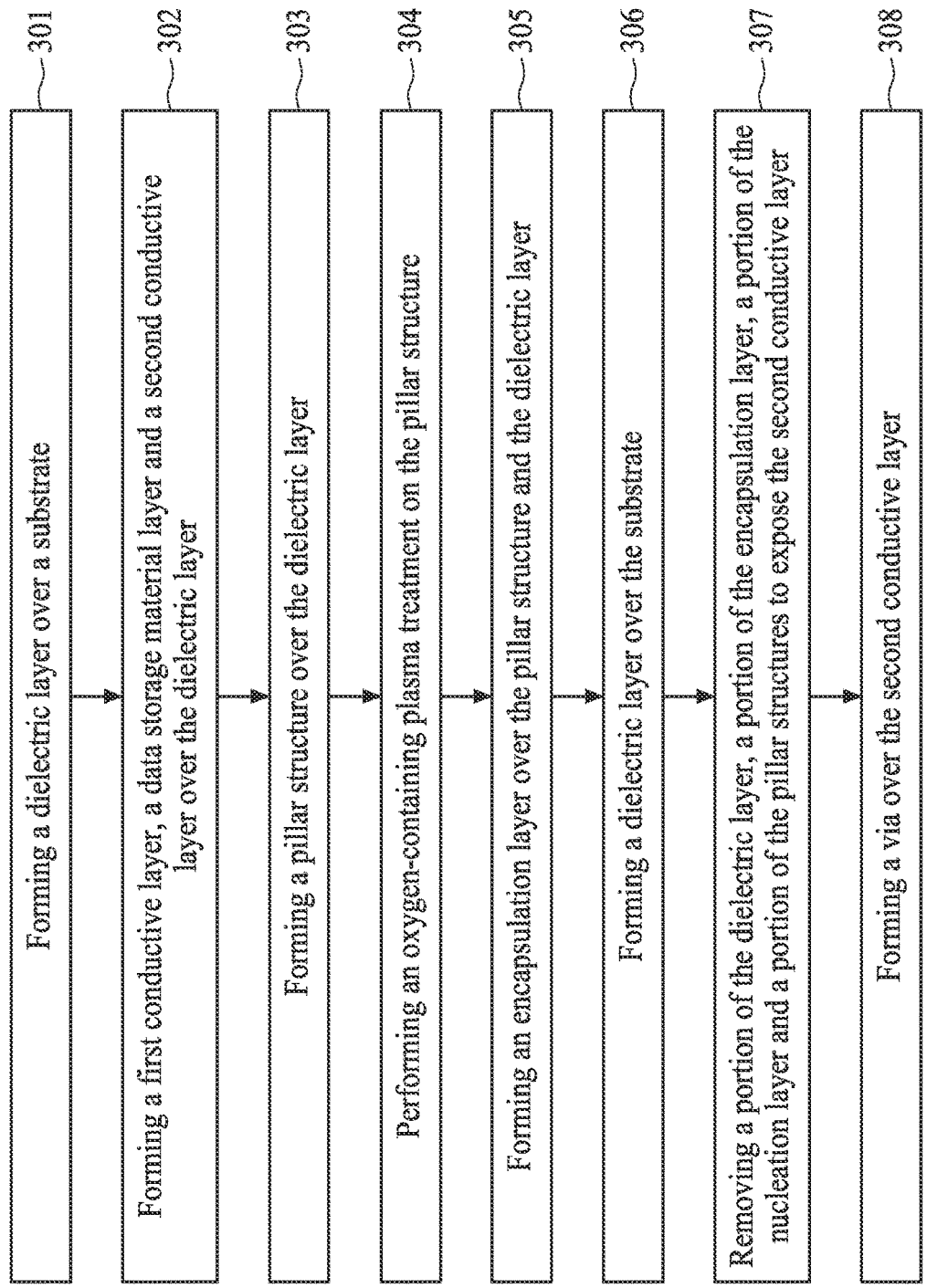
FIG. 3 shows a flowchart representing method for forming a semiconductor memory structure according to aspects of the present disclosure.

FIG. 3 is a flowchart representing a method for forming a semiconductor memory structure 30 according to aspects of the present disclosure. The method 30 includes a number of operations (301, 302, 303, 304, 305, 306, 307 and 308). The method for forming the semiconductor structure 30 will be further described according to one or more embodiments. It should be noted that the operations of the method for forming the semiconductor memory structure 30 may be rearranged or otherwise modified within the scope of the various aspects. It should further be noted that additional processes may be provided before, during, and after the method 30, and that some other processes may only be briefly described herein. Thus other implementations are possible within the scope of the various aspects described herein.

At operation 301, a substrate is received and a dielectric layer is formed over the substrate. In some embodiments, the substrate can be the substrate 100 as shown in FIG. 1, but the disclosure is not limited thereto. Further, in some embodiments, an interconnect structure 130 can be formed over the substrate 100. A dielectric layer 130 can be formed over the substrate 100. In some embodiments, the dielectric layer 130 can include materials similar to those used to form the inter-metal dielectric layers IMDn, and therefore such details are omitted in the interest of brevity. In some embodiments, the dielectric layer 130 can be one of the inter-metal dielectric layers IMDn.

In some embodiments, a bottom via BEVA can be formed in the dielectric layer 130. In such embodiments, a trench (not shown) may be formed in the dielectric layer 130, a barrier layer (not shown) may be formed to line a bottom and sidewalls of the trench, and a conductive layer (not shown) may be formed on the barrier layer and to fill the trench. The conductive layer can include materials similar to those used to form the metal layers Mn, and therefore details thereof are omitted for brevity. It should be understood that to mitigate metal diffusion, which may adversely affect electrical isolation of the surrounding IMD layers, the barrier layer may be required. Therefore, when the conductive layer includes Cu, the barrier layer can include conductive materials that form a Cu diffusion barrier. In some embodiments, a planarization may be performed to remove a superfluous conductive layer and a superfluous barrier layer. Accordingly, the bottom via BEVA can be obtained, as shown in FIG. 4.

Figure 4:
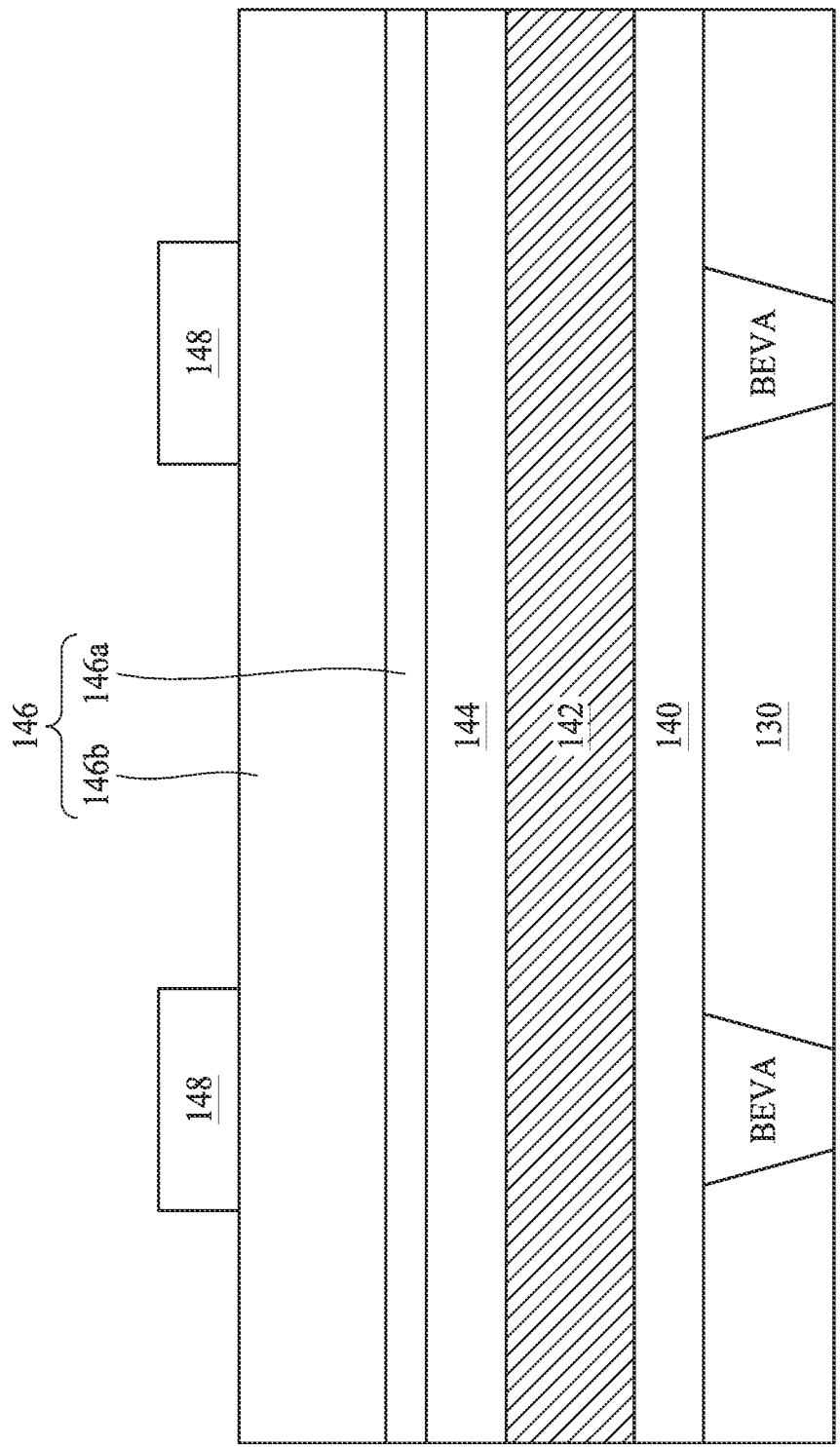
FIG. 4 is a schematic drawing illustrating a semiconductor memory structure at a fabrication stage constructed according to aspects of the present disclosure in one or more embodiments.

As shown in FIG. 4, at operation 302, a first conductive layer 140, a data storage material layer 142 and a second conductive layer 144 are sequentially formed over the bottom via BEVA and the dielectric layer 130. The first conductive layer 140 and the second conductive layer 144 can include metals, metal nitrides, or other suitable other conductive materials as mentioned above; therefore, description of such details are omitted for brevity. The data storage material layer 142 can include different materials depending on the type of the memory cell to be formed. Because the materials used to form the data storage material layer 142 can be similar as those mentioned above, therefore those details are omitted for brevity. A hard mask layer 146 can be formed on the second conductive layer 144. In some embodiments, the hard mask layer 146 can include a first layer 146a and a second layer 146b. In such embodiments, the first layer 146a and the second layer 146b can include different materials. For example, the first layer 146a can include silicon nitride, and the second layer 146b can include silicon oxide, but the disclosure is not limited thereto. Further, a patterned photoresist layer 148 can be formed over the hard mask layer 146, as shown in FIG. 4.

In some embodiments, the hard mask layer 146 can be patterned through the patterned photoresist layer 148, and the patterned photoresist layer 148 is subsequently removed.

Figure 5:
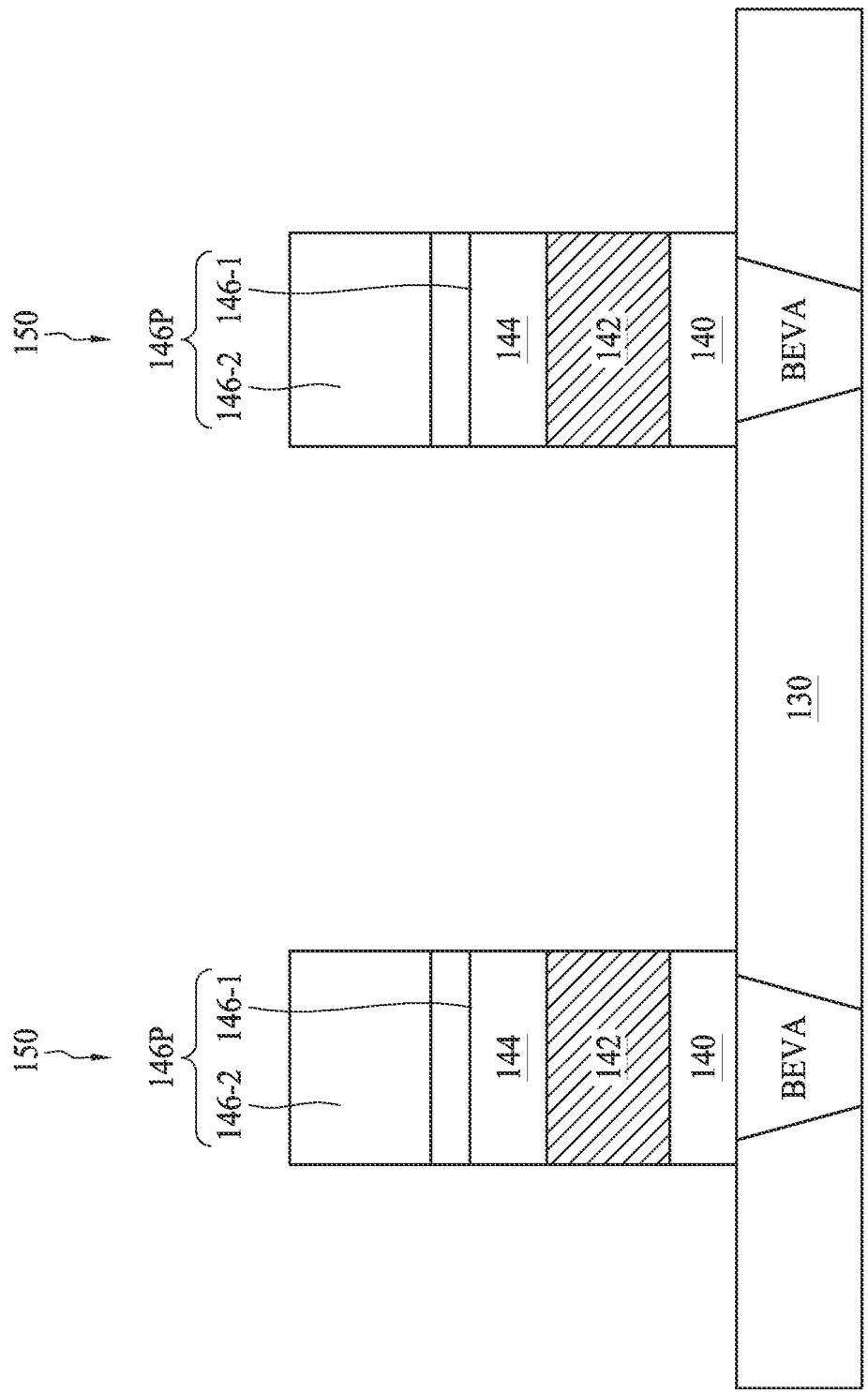
FIG. 5 is a schematic drawing illustrating a semiconductor memory structure at a fabrication stage subsequent to that illustrated in FIG. 4 according to aspects of the present disclosure in one or more embodiments.

Referring to FIG. 5, at operation 303, a pillar structure 150 is formed over the dielectric layer 130. In some embodiments, the second conductive layer 144, the data storage material layer 142 and the first conductive layer 142 are etched through the patterned hard mask layer 146P. Accordingly, a pillar structure 150 is formed over the dielectric layer 130. In some embodiments, the pillar structure 150 is formed over the bottom via BEVA, as shown in FIG. 5. In some embodiments, a width of the pillar structure 150 is greater than a width of the bottom via BEVA. Further, a height of the pillar structure 150 is greater than the width of the pillar structure 150. In some embodiments, an aspect ratio (height to width) of the pillar structure 150 is greater than approximately 20, but the disclosure is not limited thereto. The aspect ratio of the pillar structure 150 can be adjusted according to different product designs or process requirements. Accordingly, the pillar structure 150 includes the first conductive layer 140, the second conductive layer 142, and the data storage material layer 144 between the first conductive layer 140 and the second conductive layer 142 and the patterned mask layer 146P. In some embodiments, a spacing distance between adjacent two pillar structures 150 can be between approximately 15 nm and approximately 40 nm, but the spacing distance can be adjusted according to different product design. Further, a sidewall of the pillar structure 150, i.e., a sidewall of the first conductive layer 140, a sidewall of the data storage material layer 142 and a sidewall of the second conductive layer 144, is exposed, as shown in FIG. 5.

As shown in FIG. 6A, at operation 304, an oxygen-containing plasma treatment 160 is performed on the pillar structure 150. In some embodiments, the oxygen-containing plasma treatment 160 includes at least one material selected from a group consisting of $N_2$, $O_2$, $O_3$ and $H_2O$. In other embodiments, the oxygen-containing plasma treatment 160 can include any suitable material including oxygen radicals. In some embodiments, a duration of the oxygen-containing plasma treatment 160 is adjusted according to different product design or process requirements.

Referring to FIG. 6A, in some embodiments, the oxygen-containing plasma treatment 160 is performed to make a sidewall surface of the first conductive layer 140 a hydrophilic surface, a sidewall surface of the data storage material layer 142 a hydrophilic surface and a sidewall surface of the second conductive layer 144 a hydrophilic surface. In such embodiments, a nucleation layer 230 can be formed over the sidewall of the first conductive layer 140, the sidewall of the data storage material layer 142 and the sidewall of the second conductive layer 144. A thickness of the nucleation layer 230 may be less than 1 Å; thus, the nucleation layer 230 is referred to as the hydrophilic surfaces of the first conductive layer 140, the data storage material layer 142 and the second conductive layer 144.

Figure 6B:
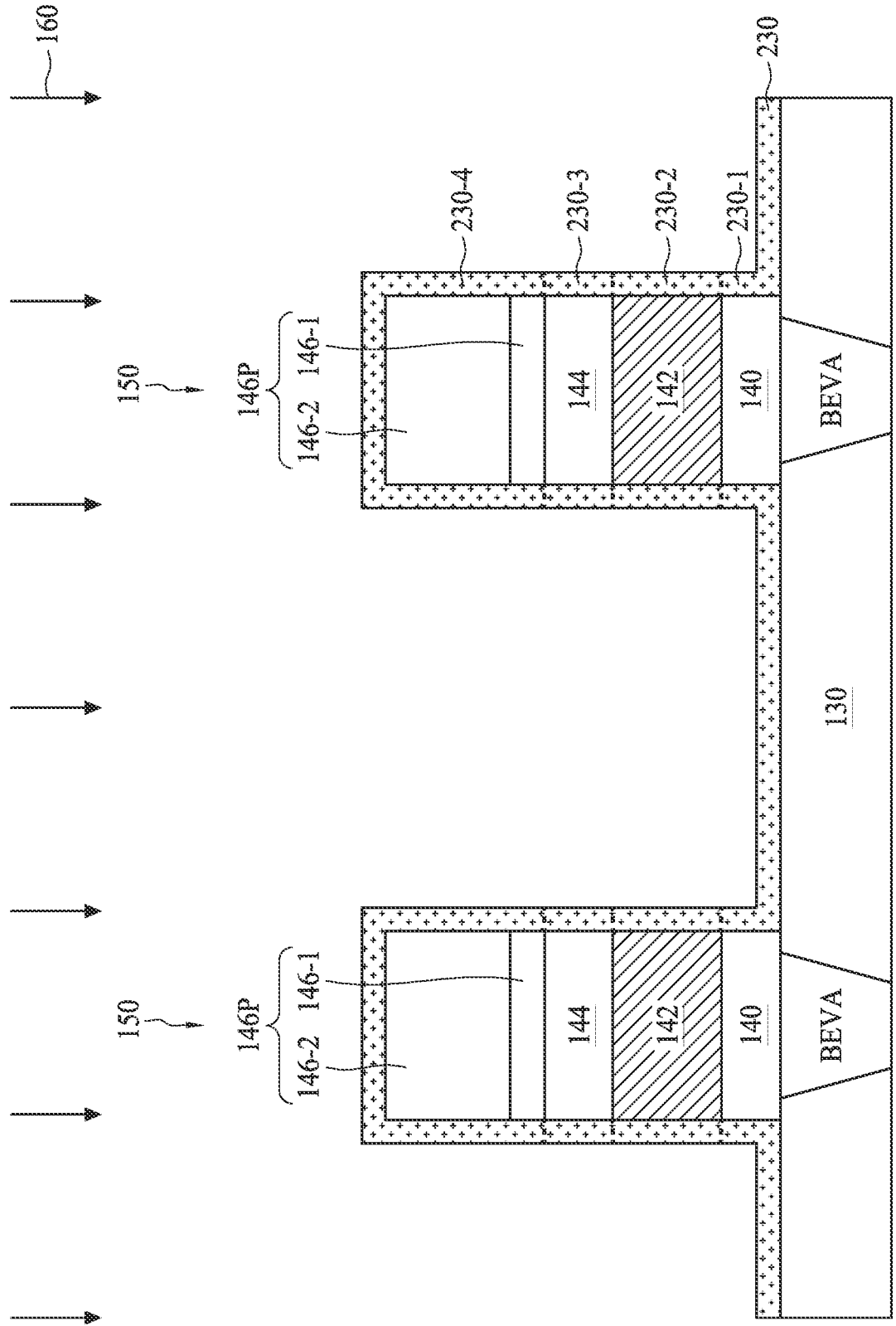

In some embodiments, the duration can be increased such that a nucleation layer 230 is formed to have a thickness between approximately 1 Å and 10 Å, as shown in FIG. 6B. Additionally, the thickness of the nucleation layer 230 can be consistent, as shown in FIG. 6B, but the disclosure is not limited thereto. In such embodiments, if the thickness of the nucleation layer 230 is greater than 10 Å, then the distance between adjacent pairs of pillar structures 150 may be too small, such that a gap-filling issue may arise in subsequent manufacturing operations. The nucleation layer 230 includes the abovementioned hydrophilic surface.

Figure 6C:
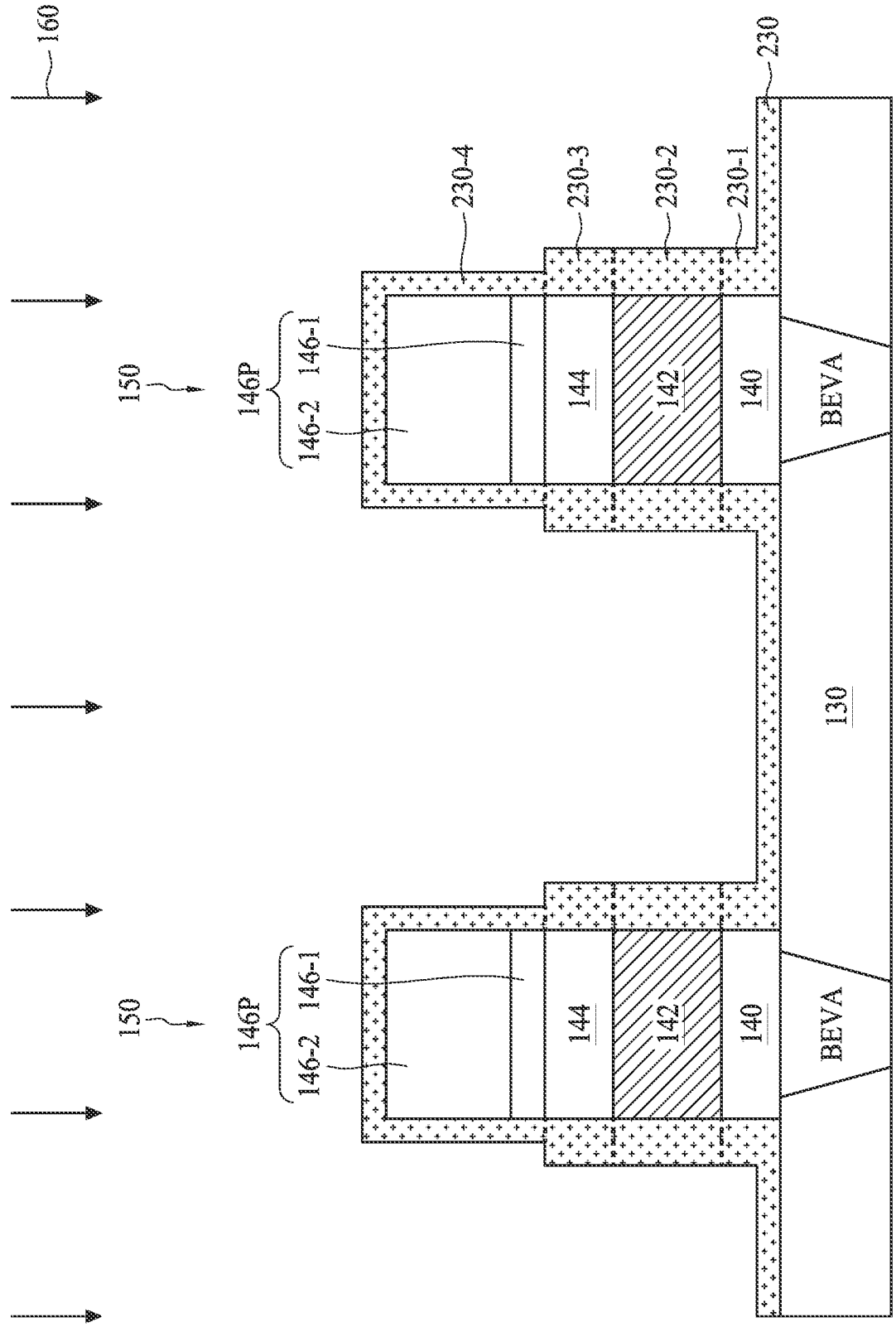

In other embodiments, the duration can be further increased such that the nucleation layer 230 is formed to have an inconsistent thickness. In such embodiments, the thickness of the nucleation layer 230 is still kept between approximately 1 Å and 10 Å in order to avoid the gap-filling issue. It is found that oxygen radicals present during the oxygen-containing plasma treatment 160 tend to react with metal materials in the first conductive layer 140, the data storage material layer 142 and the second conductive layer 144. In other words, more oxygen radicals react with the metal materials in the first conductive layer 140, the data storage material layer 142 and the second conductive layer 144 than react with the insulating materials in the patterned hard mask layer 146P. In addition, when the duration of the oxygen-containing plasma treatment 160 is increased, the difference in quantities of reacting oxygen radicals is more significant. Consequently, a thickness of a portion of the nucleation layer 230 over the first conductive layer 140, the data storage material layer 142 and the second conductive layer 144 is greater than a thickness of a portion of the nucleation layer 230 over the patterned hard mask layer 146P, as shown in FIG. 6C. Further, the nucleation layer 230 includes the abovementioned hydrophilic surface.

Referring to FIGS. 6B and 6C, in some embodiments, the nucleation layer 230 can include a first portion 230-1 over the sidewall of the first conductive layer 140, a second portion 230-2 over the sidewall of the data storage material layer 142, a third portion 230-3 over the sidewall of the second conductive layer 144, and a fourth portion 230-4 over the sidewall of the patterned hard mask layer 146P. The first portion 230-1 and the third portion 230-3 can include the same material. In some embodiments, the materials of the first portion 230-1 and the third portion 230-3 can be similar to materials of portions described above; therefore, description of such details are omitted for brevity. In some embodiments, the material of the second portion 230-2 is different from the materials of the first portion 230-1 and the third portion 230-3. The materials of the second portion 230-2 can be similar to materials of portion described above; therefore, descriptions of such details are omitted for brevity. In some embodiments, the fourth portion 230-4 includes a material different from the materials of the first, second and third portions 230-1, 230-2 and 230-3.

As mentioned above, the thickness of the nucleation layer 230 is between approximately 1 Å and approximately 10 Å. In some embodiments, as shown in FIG. 6A, the thickness of the nucleation layer 230 is approximately 1 Å, and thus the nucleation layer 230 can be referred to as a hydrophilic surface. In some embodiments, as shown in FIGS. 6B and 6C, the thickness of the nucleation layer 230 is equal to or less than approximately 10 Å in order to avoid reducing the spacing distance between the adjacent two pillar structures 150.

Figure 7A:
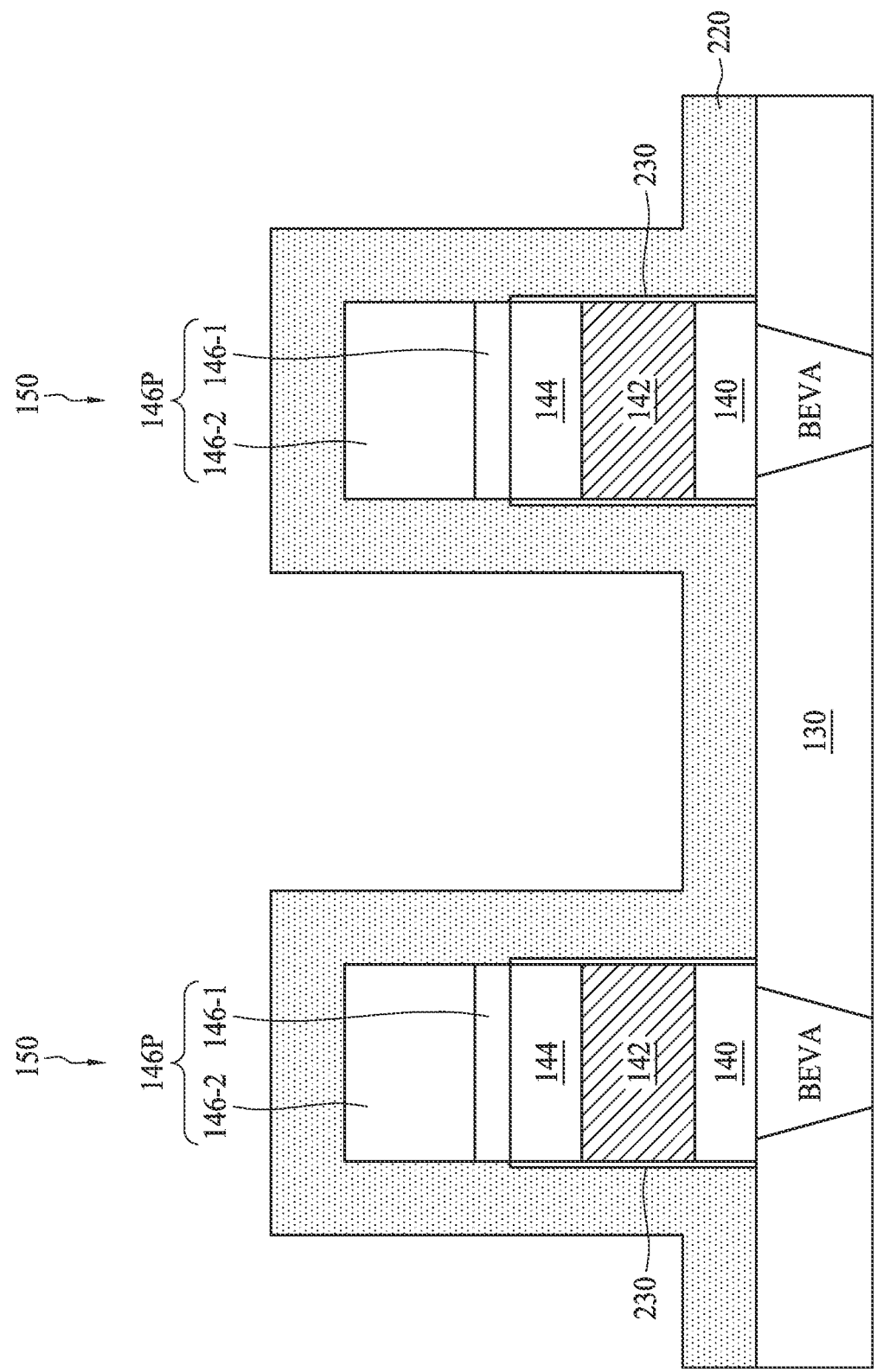
FIG. 7A is a schematic drawing illustrating a semiconductor memory structure at a fabrication stage subsequent to that illustrated in FIG. 6A.
Figure 7B:
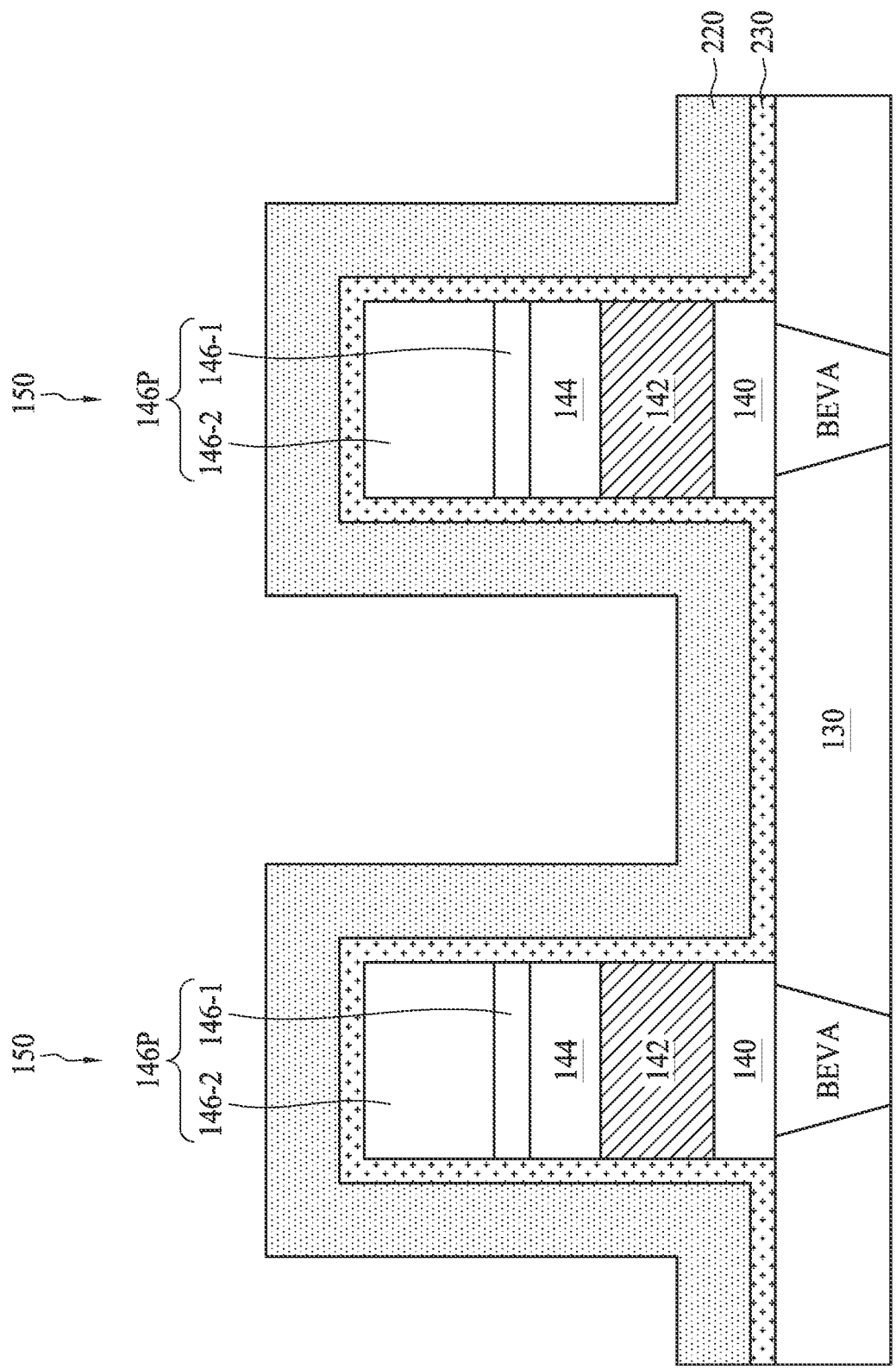
FIG. 7B is a schematic drawing illustrating a semiconductor memory structure at a fabrication stage subsequent to that illustrated in FIG. 6B.
Figure 7C:
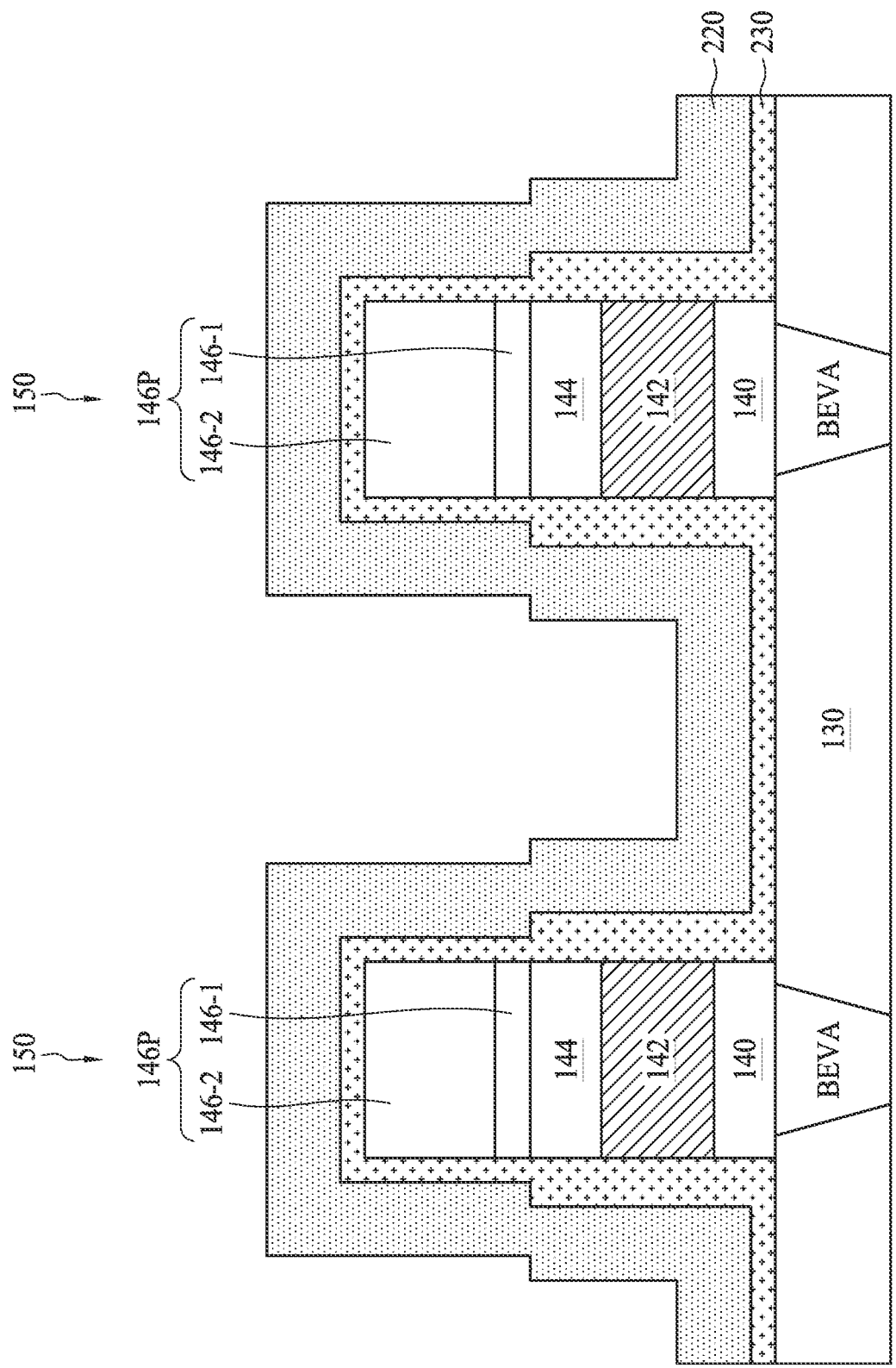
FIG. 7C is a schematic drawing illustrating a semiconductor memory structure at a fabrication stage subsequent to that illustrated in FIG. 6C.

FIGS. 7A, 7B and 7C are schematic drawings illustrating a semiconductor memory structure at fabrication stages respectively subsequent to those illustrated in FIGS. 6A, 6B and 6C. At operation 305, an encapsulation layer 220 is formed over the pillar structure 150 and the dielectric layer 130. The materials used to form the encapsulation layer 220 can be similar to materials described above; therefore, descriptions of such details are omitted for brevity. In some embodiments, the encapsulation layer 220 can be formed by an atomic layer deposition (ALD), but the disclosure is not limited thereto. During the forming of the encapsulation layer 220, the hydrophilic surface of the sidewalls of the first conductive layer 140, the data storage material layer 142 and the second conductive layer 144 provides a suitable surface for a layer deposition or layer growth. Therefore, an incubation time for forming the encapsulation layer 220 on the sidewalls of the first conductive layer 140, the data storage material layer 142 and the second conductive layer 144 can be reduced, and thus incubation delay between the surface of the insulating material (i.e., the patterned hard mask layer 146P) and the surface of the conductive material (i.e., the first conductive layer 140, the data storage material layer 142 and the second conductive layer 144) can be mitigated. Consequently, a thickness uniformity of the encapsulation layer 220 can be improved, as shown in FIG. 7A.

Referring to FIGS. 7B and 7C, in some embodiments, the nucleation layer 230 over the sidewalls of the first conductive layer 140, the data storage material layer 142, the second conductive layer 144, and the patterned hard mask layer 146P provides a hydrophilic surface which is suitable for the forming of the encapsulation layer 220. Further, because the nucleation layer 230 is formed to completely cover the sidewall of the pillar structures 150, a uniform hydrophilic surface can be obtained over the entirety of the exposed surface, including that of the dielectric layer 130. Consequently, the encapsulation layer 220 can be formed on this uniform and suitable surface, and thus a thickness uniformity of the encapsulation layer 220 can be further improved, as shown in FIGS. 7B and 7C.

A thickness of the encapsulation layer 220 is between approximately 20 Å and approximately 60 Å. If the thickness of the encapsulation layer 220 is less than approximately 20 Å, it may not be thick enough to protect the first conductive layer 140, the data storage material layer 142 and the second conductive layer 144, and as a result such layers could be damaged in subsequent manufacturing operations. However, if the thickness of the encapsulation layer 220 is greater than 60 Å, the spacing distance between adjacent pairs of pillar structures 150 may be reduced, and thus the manufacturing operation may incur the gap-filling issue, as detailed in the following description.

Figure 8A:
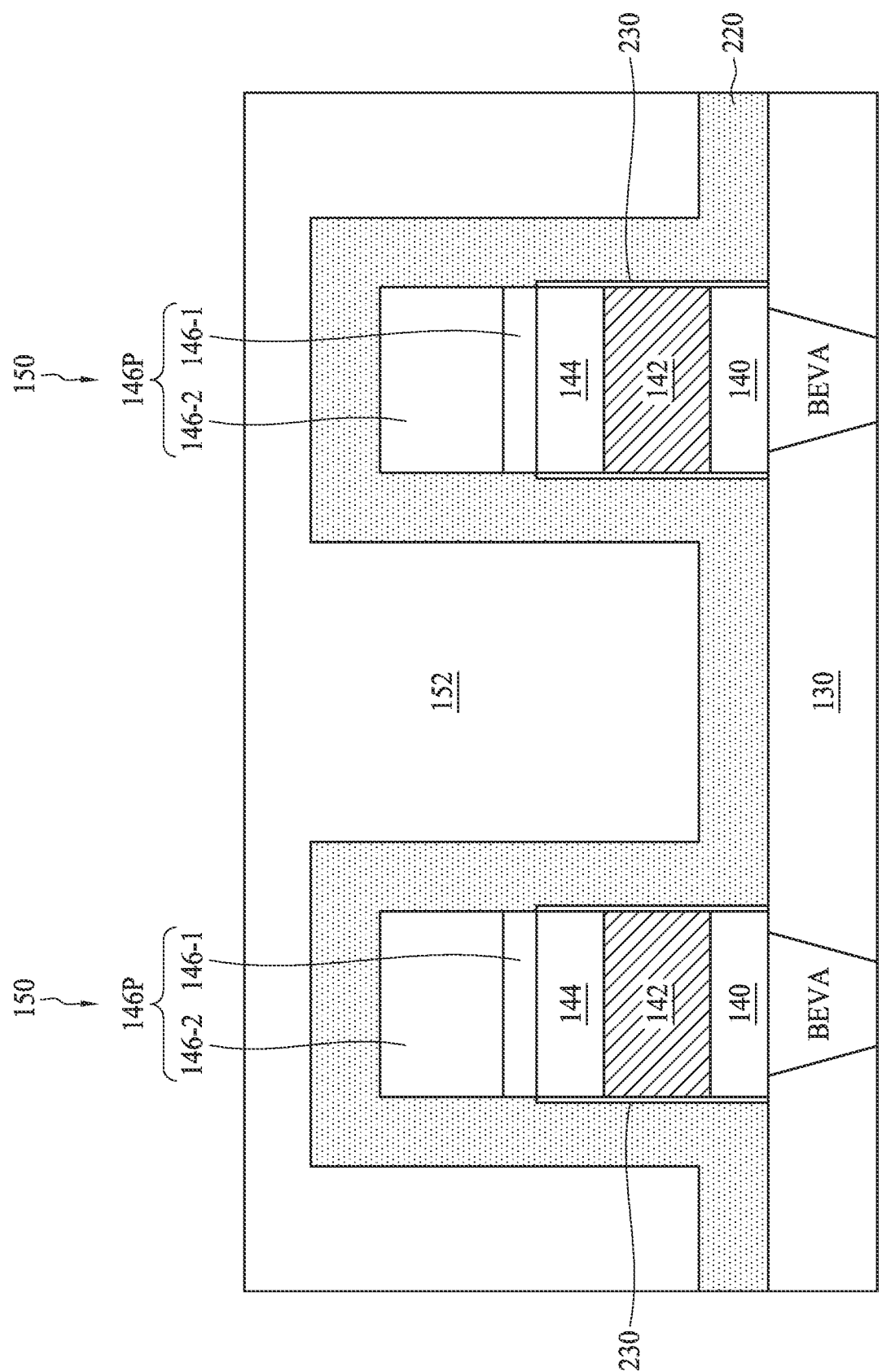
FIG. 8A is a schematic drawing illustrating a semiconductor memory structure at a fabrication stage subsequent to that illustrated in FIG. 7A.
Figure 8B:
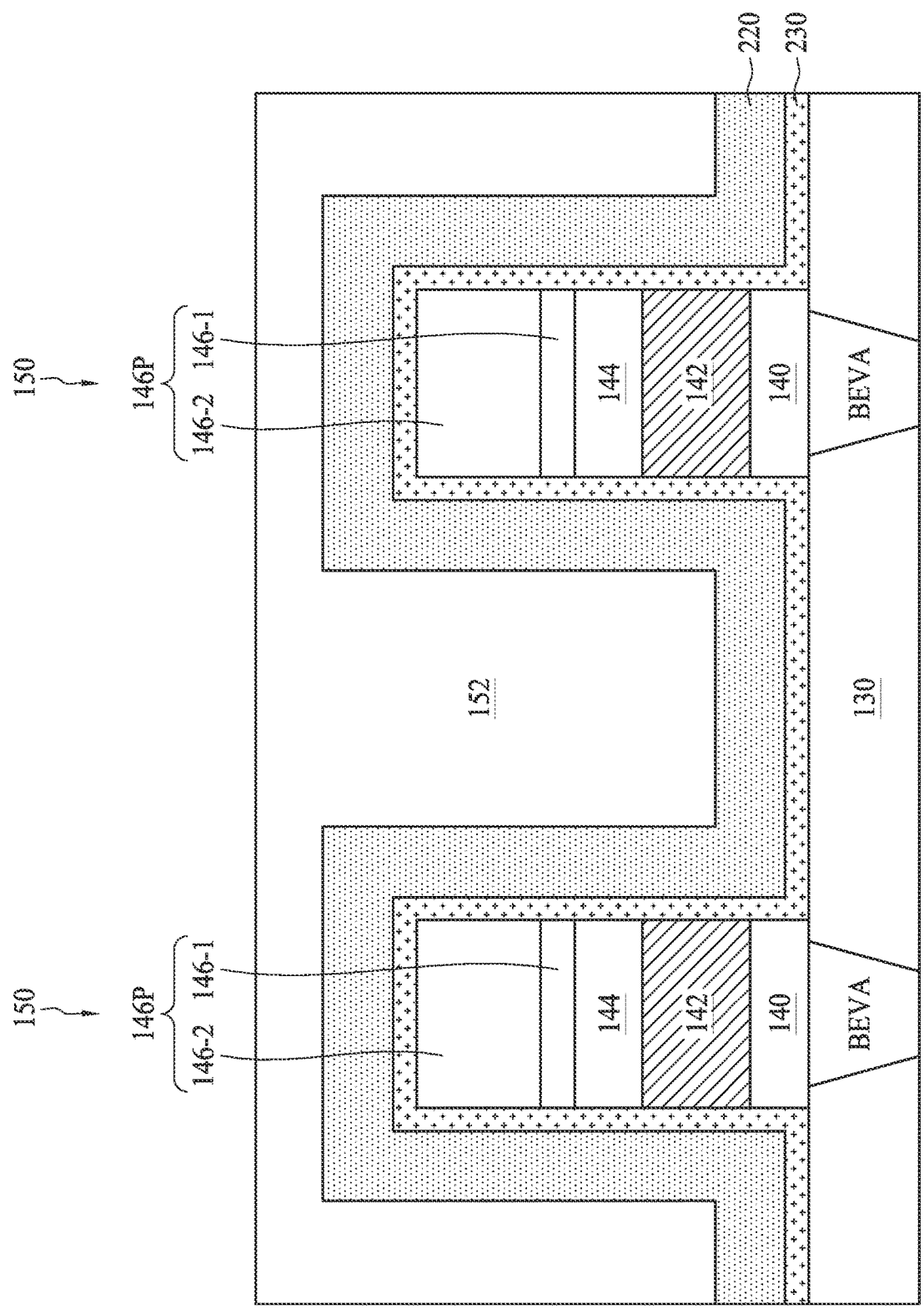
FIG. 8B is a schematic drawing illustrating a semiconductor memory structure at a fabrication stage subsequent to that illustrated in FIG. 7B.
Figure 8C:
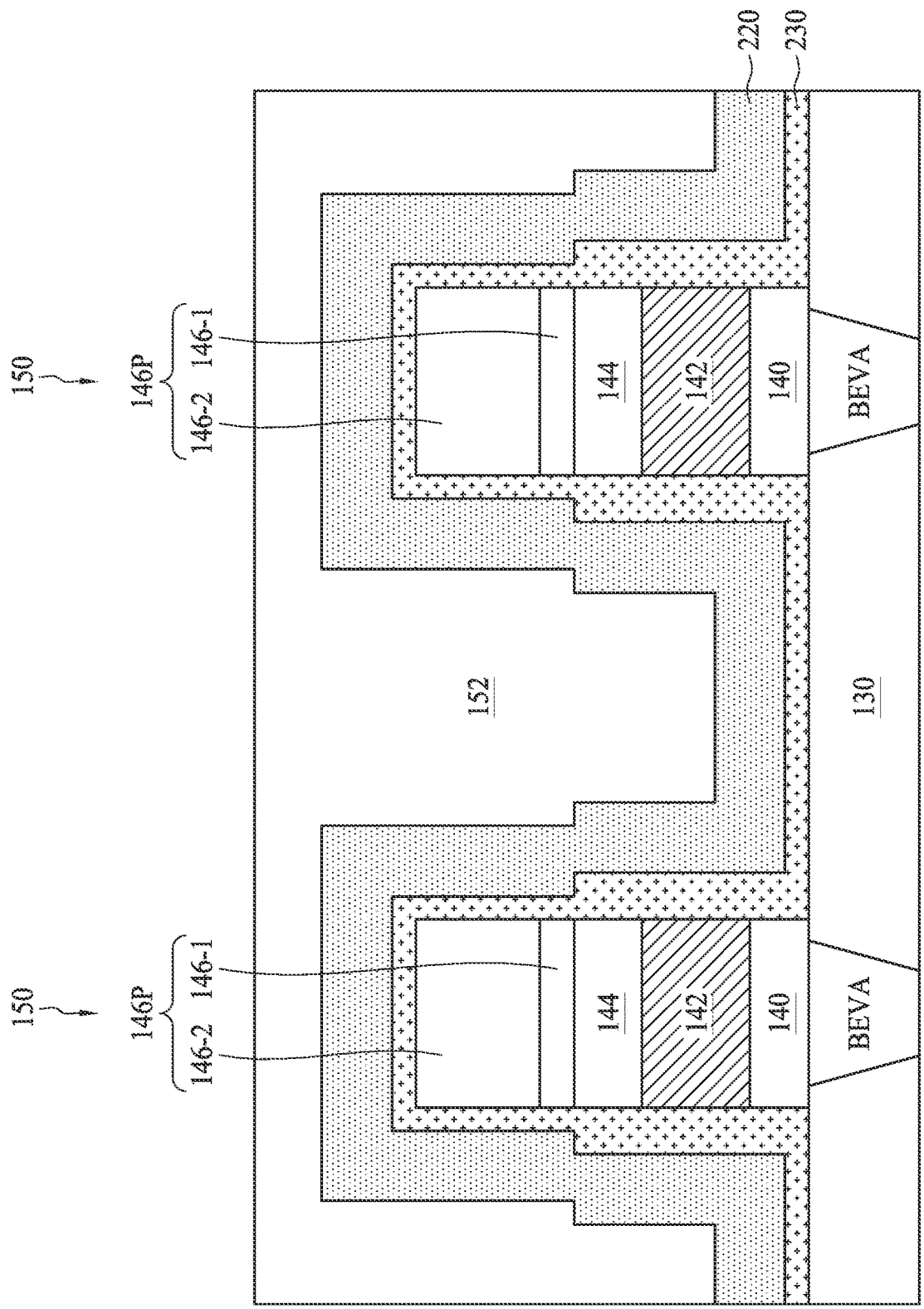
FIG. 8C is a schematic drawing illustrating a semiconductor memory structure at a fabrication stage subsequent to that illustrated in FIG. 7C.

FIGS. 8A, 8B and 8C are schematic drawings illustrating a semiconductor memory structure at fabrication stages respectively subsequent to those illustrated in FIGS. 7A, 7B and 7C. At operation 306, a dielectric layer 152 is formed over the substrate. As shown in FIGS. 8A to 8C, the dielectric layer 152 is formed to cover the dielectric layer 130 and to embed the pillar structures 150, the encapsulation layer 220 and the nucleation layer 230. As mentioned above, if the thickness of the encapsulation layer 220 is greater than 60 Å, the spacing distance between adjacent pairs of pillar structures 150 may be reduced, and the forming of the dielectric layer 152 may incur the gap-filling issue between the pillar structures 150.

Figure 9A:
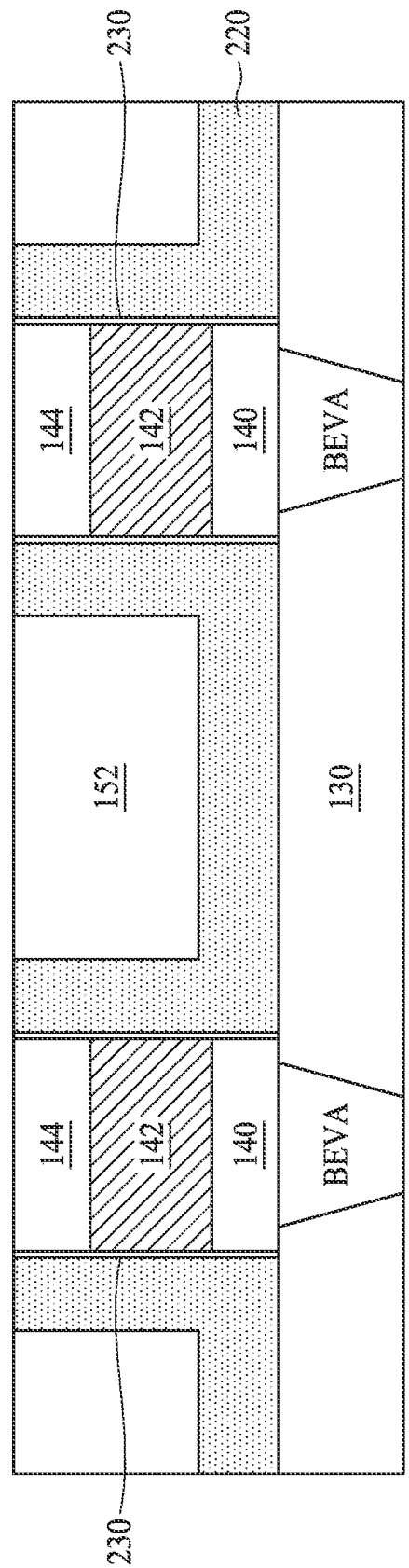
FIG. 9A is a schematic drawing illustrating a semiconductor memory structure at a fabrication stage subsequent to that illustrated in FIG. 8A.
Figure 9B:
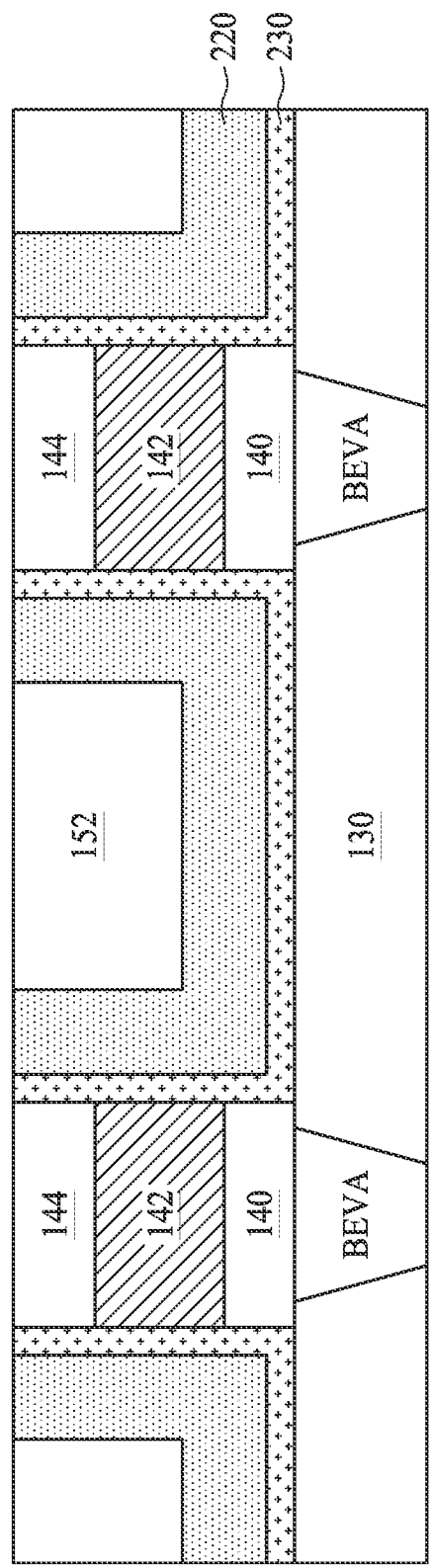
FIG. 9B is a schematic drawing illustrating a semiconductor memory structure at a fabrication stage subsequent to that illustrated in FIG. 8B.
Figure 9C:
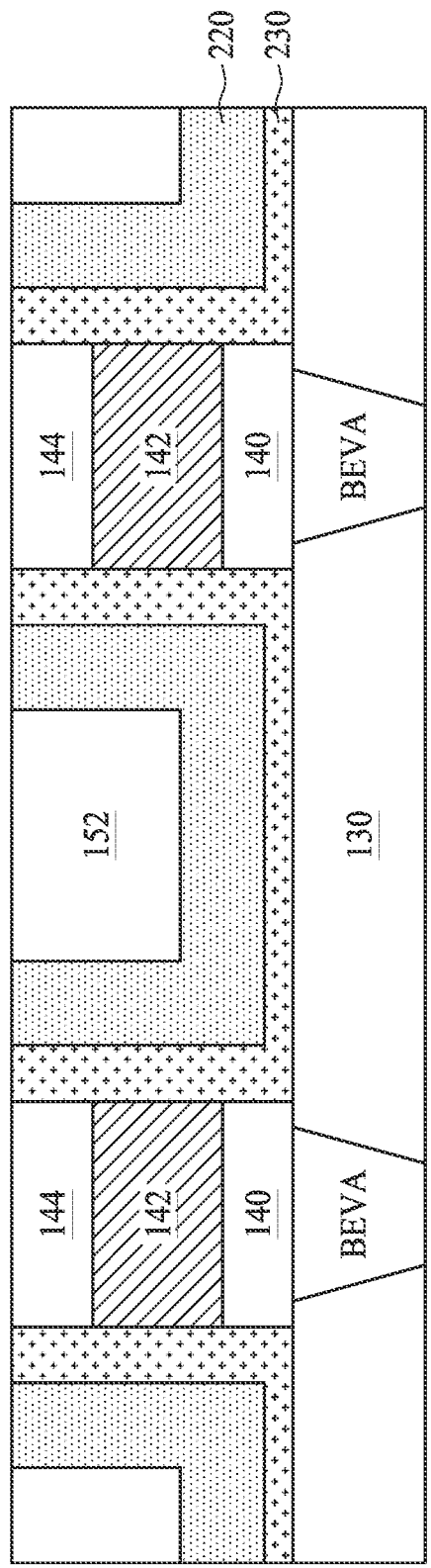
FIG. 9C is a schematic drawing illustrating a semiconductor memory structure at a fabrication stage subsequent to that illustrated in FIG. 8C.

At operation 307, a portion of the dielectric layer 152, a portion of the encapsulation layer 220, a portion of the nucleation layer 230, a portion of the pillar structures 150 and the patterned hard mask layer 146P are removed. In some embodiments, a planarization operation such as a CMP operation or a suitable dry etching can be performed to remove the portion of the dielectric layer 152, the portion of the encapsulation layer 220, the portion of the nucleation layer 230, the portion of the pillar structures 150 and the patterned hard mask layer 146P. Consequently, the second conductive layer 144 is exposed as shown in FIGS. 9A to 9C. In some embodiments, a top surface of the dielectric layer 152, a topmost surface of the encapsulation layer 220, a topmost surface of the nucleation layer 230 and a top surface of the second conductive layer 144 are aligned with each other. In some embodiments, the top surface of the dielectric layer 152, the topmost surface of the encapsulation layer 220, the topmost surface of the nucleation layer 230 and the top surface of the second conductive layer 144 are substantially at a same level, as shown in FIGS. 9A to 9C.

Figure 10:
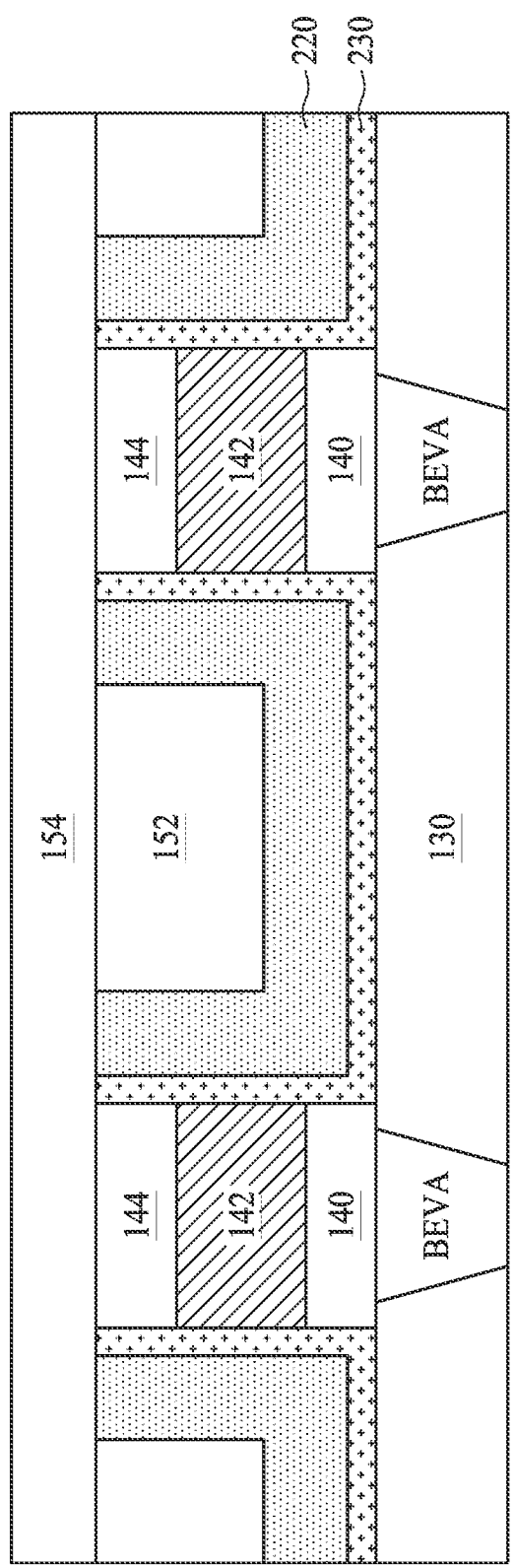
FIG. 10 is a schematic drawing illustrating a semiconductor memory structure at a fabrication stage subsequent to that illustrated in FIG. 9B according to aspects of the present disclosure in one or more embodiments.

At operation 308, a via TEVA is formed over the second conductive layer 144. Please refer to FIG. 10, which is a schematic drawing illustrating a semiconductor memory structure at a fabrication stage subsequent to that illustrated in FIG. 9B according to aspects of the present disclosure in different embodiments. It should be noted that FIG. 10 can be a schematic drawing illustrating a semiconductor memory structure at a fabrication stage subsequent to those illustrated in FIGS. 9A and 9C because operation 308 can be performed on the semiconductor structures shown in FIGS. 9A and 9C. In some embodiments, another dielectric layer 154 is formed over the substrate 100. As shown in FIG. 10, the dielectric layer 154 is blanketly formed to cover the dielectric layer 152, the encapsulation layer 220, the nucleation layer 230 and the second conductive layer 144.

Figure 11:
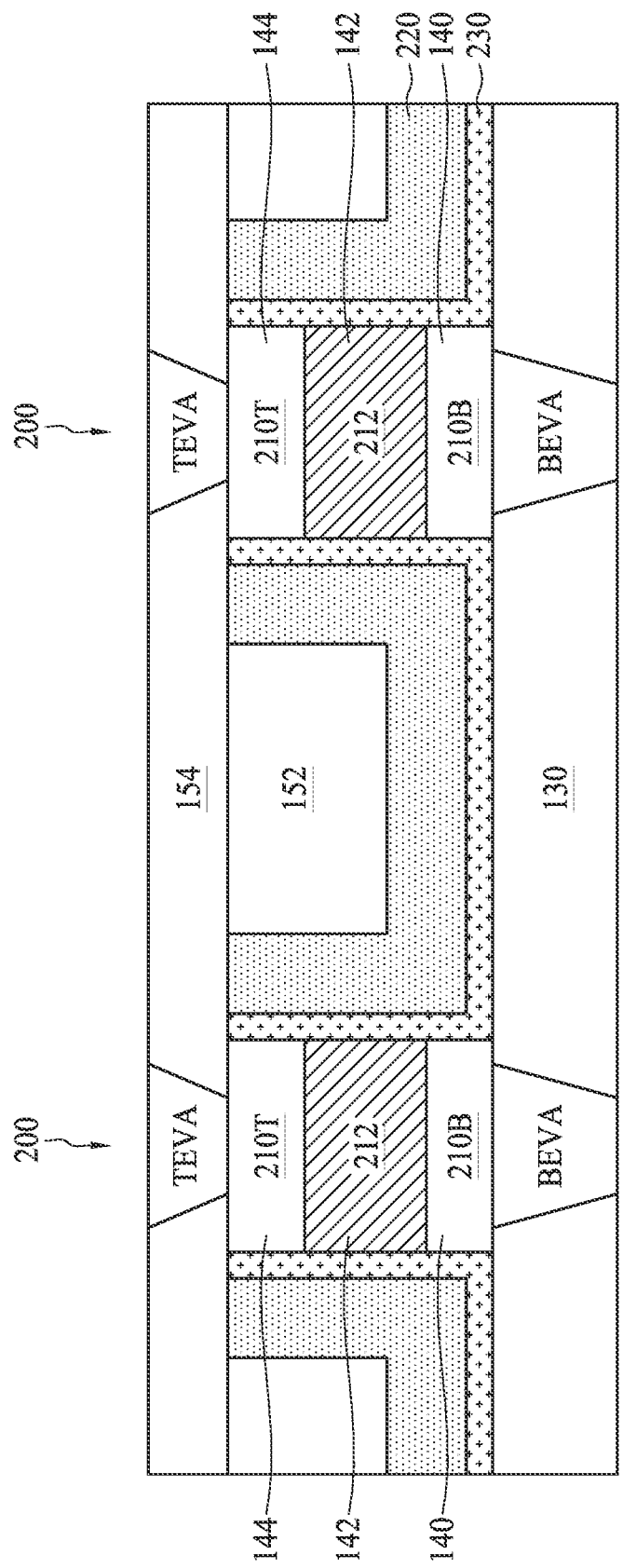
FIG. 11 is a schematic drawing illustrating a semiconductor memory structure at a fabrication stage subsequent to that illustrated in FIG. 10 according to aspects of the present disclosure in one or more embodiments.

In some embodiments, a trench (not shown) may be formed in the dielectric layer 154, a barrier layer (not shown) may be formed to line a bottom and sidewalls of the trench, and a conductive layer (not shown) may be formed on the barrier layer and to fill the trench. The conductive layer can include materials similar to those used to form the metal layers Mn; therefore, descriptions of such details are omitted for brevity. It should be understood that to mitigate metal diffusion, which may adversely affect electrical isolation of the surrounding IMD layers, the barrier layer may be required. Therefore, when the conductive layer includes Cu, the barrier layer can include conductive materials that form a Cu diffusion barrier. In some embodiments, a planarization may be performed to remove a superfluous conductive layer and a superfluous barrier layer. Accordingly, a via, such as a top via TEVA, can be obtained. The top via TEVA is coupled to the second conductive layer 144, as shown in FIG. 11.

In some embodiments, the dielectric layer 130, the dielectric layer 152, and the dielectric layer 154 together can be referred to as an inter-metal dielectric layer IMDn, such as an inter-metal dielectric layer IMD4 shown in FIG. 1. Accordingly, a semiconductor memory structure 200 is formed in the inter-metal dielectric layer IMD4 in a memory region 102M, as shown in FIGS. 1 and 11. In such embodiments, the first conductive layer 140 serves as the bottom electrode 210B, the data storage material layer 142 serves as the data-storage element 212, and the second conductive layer 144 serves as the top electrode 210T. Further, the semiconductor memory structure 200 can be electrically connected to other metal layers such as the metal layers M3 and M4 through the bottom via BEVA and the top via TEVA, as shown in FIGS. 1 and 11.

In some embodiments, a connecting via V3 can be formed in the logic region 102L such that the metal layer M3 and the metal layer M4 in the logic region 102L can be electrically connected. As mentioned above, the height of the via V3 can be substantially equal to the sum of the height of the top via TEVA, the height of the bottom via BETA and the height of the semiconductor memory structure 200, as shown in FIG. 1.

Accordingly, the present disclosure provides a semiconductor structure including a memory device and a method for forming the same. In the semiconductor structure, a hydrophilic surface or a nucleation layer is formed prior to forming of the encapsulation layer. The hydrophilic surface and the nucleation layer provide a uniform surface that is suitable for the forming of the encapsulation layer. In some embodiments, the hydrophilic surface and the nucleation layer can be formed by an oxygen-containing (O-containing) plasma treatment. In some embodiments, the incubation delay issue can be mitigated by the hydrophilic surface or the nucleation layer. In some embodiments, it is found that the step coverage issue can be also mitigated by the hydrophilic surface or the nucleation layer. Consequently, a thickness uniformity of the encapsulation layer is improved.

In some embodiments, a method for forming a semiconductor memory structure is provided. The method includes following operations. A pillar structure is formed over a dielectric layer. The pillar structure includes a first conductive layer, a second conductive layer and a data storage material layer between the first conductive layer and the second conducive layer. A sidewall of the first conductive layer, a sidewall of the data storage layer and a sidewall of the second conductive layer are exposed. An oxygen-containing plasma treatment is performed on the pillar structure to form hydrophilic surfaces of the sidewall of the first conductive layer, the sidewall of the data storage layer and the sidewall of the second conductive layer. An encapsulation layer is formed over the pillar structure and the dielectric layer. The encapsulation layer is in contact with the hydrophilic surfaces of the sidewall of the first conductive layer, the sidewall of the data storage layer and the sidewall of the second conductive layer.

In some embodiments, a method for forming a semiconductor memory structure is provided. The method includes following operations. A pillar structure is formed over a first dielectric layer. The pillar structure includes a first conductive layer, a second conductive layer and a data storage material layer between the first conductive layer and the second conducive layer. An oxygen-containing plasma treatment is performed on the pillar structure to form a nucleation layer covering the pillar structure and the first dielectric layer. An encapsulation layer is formed over the nucleation layer. The encapsulation layer includes a first portion over a sidewall of the first conductive layer, a second portion over a sidewall of the data storage material layer and a third portion over a sidewall of the second conductive layer. The second portion includes a material different from a material of the first portion and a material of the third portion.

In some embodiments, a method for forming a semiconductor memory structure is provided. The method includes following operations. A pillar structure is formed over a first dielectric layer. The pillar structure includes a first conductive layer, a data storage material layer over the first conductive layer, a second conductive layer over the data storage material layer, and a patterned hard mask layer over the second conductive layer. An oxygen-containing plasma treatment is performed on the pillar structure to form a nucleation layer covering the pillar structure and the first dielectric layer. An encapsulation layer is formed over the pillar structure and the first dielectric layer. The encapsulation layer includes a first portion over a sidewall of the first conductive layer, a second portion over a sidewall of the data storage material layer, a third portion over a sidewall of the second conductive layer, and a fourth portion over a sidewall of the patterned hard mask layer. A thickness of the fourth portion is different from a thickness of the first portion, a thickness of the second portion and a thickness of the third portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A method for forming a semiconductor memory structure, comprising:
   forming a pillar structure over a dielectric layer, wherein the pillar structure comprises a first conductive layer, a second conductive layer and a data storage material layer between the first conductive layer and the second conductive layer, and a sidewall of the first conductive layer, a sidewall of the data storage material layer and a sidewall of the second conductive layer are exposed;
   performing an oxygen-containing plasma treatment on the pillar structure to form hydrophilic surfaces of the sidewall of the first conductive layer, the sidewall of the data storage material layer and the sidewall of the second conductive layer; and
   forming an encapsulation layer over the pillar structure and the dielectric layer,
   wherein the encapsulation layer is in contact with the hydrophilic surfaces of the sidewall of the first conductive layer, the sidewall of the data storage material layer and the sidewall of the second conductive layer.

2. The method of claim 1, wherein the oxygen-containing plasma treatment comprises at least one material selected from a group consisting of $N_2O$, $O_2$, $O_3$ and $H_2O$.

3. The method of claim 1, further comprising forming a nucleation layer over the sidewall of the first conductive layer, the sidewall of the data storage material layer and the sidewall of the second conductive layer by the performing of the oxygen-containing plasma treatment, wherein the nucleation layer comprises the hydrophilic surfaces.

4. The method of claim 3, wherein a thickness of the nucleation layer is between approximately 5 Å and approximately 10 Å.

5. The method of claim 3, wherein the nucleation layer comprises a first portion over the sidewall of the first conductive layer, a second portion over the sidewall of the data storage material layer and a third portion over the sidewall of the second conductive layer, wherein the second portion comprises a material different from a material of the first portion and a material of the third portion.

6. A method for forming a semiconductor memory structure, comprising:
  forming a pillar structure over a first dielectric layer, wherein the pillar structure comprises a first conductive layer, a second conductive layer and a data storage material layer between the first conductive layer and the second conductive layer;
  performing an oxygen-containing plasma treatment on the pillar structure to form a nucleation layer covering the pillar structure and the first dielectric layer; and
  forming an encapsulation layer over the nucleation layer, wherein the nucleation layer comprises a first portion over a sidewall of the first conductive layer, a second portion over a sidewall of the data storage material layer and a third portion over a sidewall of the second conductive layer, wherein the second portion comprises a material different from a material of the first portion and a material of the third portion.

7. The method of claim 6, wherein the first portion and the third portion comprise a same material.

8. The method of claim 7, wherein the first portion and the third portion comprise hydrophilic surfaces.

9. The method of claim 6, wherein the nucleation layer has a consistent thickness.

10. The method of claim 6, wherein a thickness of the nucleation layer is between approximately 5 Å and approximately 10 Å.

11. The method of claim 6, wherein the oxygen-containing plasma treatment comprises at least one material selected from a group consisting of $N_2O$, $O_2$, $O_3$ and $H_2O$.

12. The method of claim 6, wherein in the forming of the pillar structure further comprises:
  forming the first conductive layer, the data storage material layer, the second conductive layer and a hard mask layer over the first dielectric layer; and
  patterning the first conductive layer, the data storage material layer, the second conductive layer and the hard mask layer to form the pillar structure.

13. The method of claim 12, wherein the nucleation layer is in contact with sidewalls of the hard mask layer and a top surface of the hard mask layer.

14. The method of claim 12, further comprising:
  forming a second dielectric layer over the encapsulation layer; and
  removing a portion of the second dielectric layer, a portion of the encapsulation layer, a portion of the nucleation layer and the hard mask layer to expose a top surface of the second conductive layer.

15. A method for forming a semiconductor memory structure, comprising:
  forming a pillar structure over a first dielectric layer, wherein the pillar structure comprises a first conductive layer, a data storage material layer over the first conductive layer, a second conductive layer over the data storage material layer, and a patterned hard mask layer over the second conductive layer;
  performing an oxygen-containing plasma treatment on the pillar structure to form a nucleation layer over the pillar structure; and
  forming an encapsulation layer over the pillar structure and the first dielectric layer,
  wherein the nucleation layer comprises a first portion over a sidewall of the first conductive layer, a second portion over a sidewall of the data storage material layer, a third portion over a sidewall of the second conductive layer, and a fourth portion of over a sidewall of the patterned hard mask layer, wherein a thickness of the fourth portion is different from a thickness of the first portion, a thickness of the second portion and a thickness of the third portion.

16. The method of claim 15, wherein the thickness of the fourth portion of the nucleation layer is less than the thicknesses of the first, second and third portions.

17. The method of claim 15, wherein the oxygen-containing plasma treatment comprises at least one material selected from a group consisting of $N_2O$, $O_2$, $O_3$ and $H_2O$.

18. The method of claim 15, wherein the first portion and the third portion comprise a same material, and the second portion comprises a material different from the material of the first portion and a material of the third portion.

19. The method of claim 15, further comprising:
  forming a second dielectric layer over the encapsulation layer; and
  removing a portion of the second dielectric layer, a portion of the encapsulation layer, a portion of the nucleation layer and the patterned hard mask layer to expose a top surface of the second conductive layer.

20. The method of claim 19, further comprising:
  forming a third dielectric layer over the pillar structure and the second dielectric layer; and
  forming a via in the third dielectric layer.

* * * * *